(12) United States Patent
Mizuo

(10) Patent No.: US 6,350,655 B2
(45) Date of Patent: Feb. 26, 2002

(54) SEMICONDUCTOR DEVICE AND A METHOD OF MANUFACTURING THE SAME

(75) Inventor: Yuri Mizuo, Tokyo (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/835,341

(22) Filed: Apr. 17, 2001

Related U.S. Application Data

(62) Division of application No. 09/124,059, filed on Jul. 29, 1998, now Pat. No. 6,242,788.

(30) Foreign Application Priority Data

Aug. 1, 1997 (JP) .............................................. 9-220815
Feb. 20, 1998 (JP) .............................................. 10-56245

(51) Int. Cl.$^7$ ........................ H01L 21/336; H01L 21/76
(52) U.S. Cl. ........................ 438/296; 438/404; 438/424
(58) Field of Search .............................. 438/296, 404, 438/424

(56) References Cited

U.S. PATENT DOCUMENTS

| | | | | |
|---|---|---|---|---|
| 5,128,743 | A | * 7/1992 | Tamaki et al. | ................. 357/50 |
| 5,895,253 | A | * 4/1999 | Akram | |
| 5,966,615 | A | * 10/1999 | Fazan et al. | ................. 438/424 |
| 6,130,467 | A | * 10/2000 | Bandyopadhyay et al. | . 257/506 |
| 6,274,457 | B1 | * 8/2001 | Sakai et al. | |

FOREIGN PATENT DOCUMENTS

| | | |
|---|---|---|
| JP | 63-305527 | 12/1988 |
| JP | 1-107554 | 4/1989 |
| JP | 6-21210 | 1/1994 |
| JP | 6-177239 | 6/1994 |
| JP | 7-161808 | 6/1995 |
| JP | 7-273180 | 10/1995 |

* cited by examiner

Primary Examiner—John F. Niebling
Assistant Examiner—Josetta I. Jones
(74) Attorney, Agent, or Firm—Connolly Bove Lodge & Hutz

(57) ABSTRACT

In a semiconductor device of this invention, a first trench having a uniformly inclined surface at a predetermined angle is formed downward from the surface of a semiconductor substrate. A second trench is formed vertically downward from the first trench. These trenches are filled with an insulating film to form a trench element isolation structure. The inclined surface of the first trench can disperse stepwise the electric field generated at an element isolation end and can relax concentration of electrical charges. The second trench vertically extending downward can reliably isolate elements. The semiconductor device of this invention has a trench element isolation structure made of the insulating film filling the trenches. The outer edge of a portion projecting from the semiconductor substrate is covered with a thermal oxide film formed by heat-treating a polysilicon film. The structure is more resistant to etching, cleaning, and the like. The semiconductor substrate can be satisfactorily separated from the gate electrode. According to the semiconductor device of this invention, concentration of the electric field at the element isolation end can be relaxed to improve the electrical characteristics of a transistor.

32 Claims, 38 Drawing Sheets

SEMICONDUCTOR DEVICE AND A METHOD OF MANUFACTURING THE SAME

RELATED APPLICATION

The present application is a divisional of U.S. patent application Ser. No. 09/124,059, filed Jul. 29, 1998, now U.S. Pat. No. 6,242,788.

BACKGROUND OF THE INVENTION

1. Field of the Invention

The present invention relates to a semiconductor device having an element isolation region by a trench element isolation structure out of methods of defining the element formation region in a semiconductor substrate, and a method of manufacturing the same.

2. Description of the Prior Art

A known example of structures for electrically isolating elements on a semiconductor substrate is a trench element isolation structure. In this element isolation structure, an insulating film made of, e.g., an oxide film is buried in a trench formed in, e.g., a silicon semiconductor substrate to define an element active region.

In this trench element isolation structure, an electric field tends to concentrate at the end of an element isolation region, resulting in a low threshold voltage of the MOS transistor.

To solve this problem, Japanese Patent Laid-Open Nos. 63-305527 and 1-107554 have disclosed structures in which concentration of electric fields at the end of the element isolation region is relaxed by tapering the upper portion of the trench side wall and vertically forming its lower portion in a trench element isolation structure.

Japanese Patent Laid-Open No. 6-177239 has disclosed a structure in which the entire side wall of a trench is tapered from the top to the bottom in a trench element isolation structure.

Japanese Patent Laid-Open No. 7-161808 has disclosed a method of increasing the angle of the side wall of a trench at its upper end by wet etching.

In the method disclosed in Japanese Patent Laid-Open No. 63-305527, an insulating film is buried in a trench formed in a semiconductor substrate so as not to reach the surface of the semiconductor substrate, and then the edge defined by the trench side wall and semiconductor substrate surface is anisotropically etched away to taper the upper end of the trench side wall.

In the method disclosed in Japanese Patent Laid-Open No. 1-107554, an oxide film is formed on a semiconductor substrate and processed into a mask shape used to form a trench, and then isotropic plasma etching is performed before forming a trench. The upper end of the side wall of a prospective trench is tapered in advance, and anisotropic etching is performed to form a trench, thereby completing a trench having a tapered upper end.

In the method disclosed in Japanese Patent Laid-Open No. 6-177239, dry etching is performed using a cap oxide film as a mask with nitrogen gas and oxygen gas to form a trench having an entirely tapered side wall.

In the method disclosed in Japanese Patent Laid-Open No. 63-305527, however, since the etching process window is narrow, and the edge defined by the trench side wall and semiconductor substrate surface is rounded by wet etching, a tapered surface formed from a uniform inclined surface is difficult to form.

In the method disclosed in Japanese Patent Laid-Open No. 1-107554, since the upper end is tapered by isotropic plasma etching, no inclined surface can be formed. Further, the trench is directly deepened by anisotropic etching after tapering, so the tapered shape may change upon this anisotropic etching.

In the methods disclosed in Japanese Patent Laid-Open Nos. 63-305527 and 1-107554, an oxide film must be directly formed on the semiconductor substrate to fill the trench after tapering, and etched back while being left in the trench. However, no stopper film effective for etch-back is formed.

The oxide film filling the trench, therefore, becomes flush with the semiconductor substrate surface upon etch-back. When a gate wiring layer or interconnect for a MOS transistor is formed on the oxide film filling the trench, the distance between the gate wiring layer and the semiconductor substrate is short. Accordingly, even if the upper portion of the trench is tapered, an electric field concentrates at this portion.

In the method disclosed in Japanese Patent Laid-Open No. 7-161808, since the upper end of the trench is shaped into an inclined surface by wet etching, the trench width unnecessarily widens, resulting in a large element isolation area. This obstructs micropatterning of semiconductor devices and damages the semiconductor substrate exposed in the trench.

As described above, since the taper angle of the trench upper end cannot be uniformly controlled, and the element isolation region is even with the semiconductor substrate surface, concentration of an electric field at the end of the element isolation region cannot be effectively relaxed.

When, therefore, a MOS transistor is formed using the trench element isolation structure in the prior art, the threshold voltage undesirably varies and decreases.

In the method disclosed in Japanese Patent Laid-Open No. 6-177239, since the entire side wall of the trench is tapered, no trench except for a trench having a constant aspect ratio can be formed. In other words, the trench depth is naturally determined by the trench width. To ensure satisfactory element isolation performance, the element isolation region must be made wide, which obstructs micropatterning of elements. In addition, in the trench element isolation structure, when a multilayered film serving as a trench formation mask is removed or when cleaning is performed later, the end of the insulating film filling the trench is removed to recess it from the semiconductor substrate surface.

If the gate electrode of a MOS transistor is formed over the recess, an electric field concentrates at the boundary between the insulating film and the semiconductor substrate, i.e., the element isolation end of the trench element isolation structure, resulting in a low threshold voltage and a large leakage current of the transistor.

Methods for solving this problem are disclosed in Japanese Patent Laid-Open Nos. 6-21210 and 7-273180.

According to these references, a multilayered film serving as a trench formation mask is formed on a semiconductor substrate, a trench formation portion is selectively removed to form an opening, and then a silicon oxide film is formed by CVD on the entire surface of the semiconductor substrate to temporarily fill the opening.

The silicon oxide film is removed from the multilayered film by anisotropic etching to form a side wall made of the silicon oxide film on the side wall of the multilayered film in the opening. In forming a trench in the semiconductor substrate, etching is performed using the side wall and the multilayered film as a mask.

After forming the trench, a silicon oxide film is formed by CVD to fill the trench, the silicon oxide film is removed from the multilayered film, and then the multilayered film used as a mask is removed to complete the trench element isolation structure.

According to these methods, since the opening is narrowed by the side wall on the multilayered structure, the side wall made of the silicon oxide film is left at the side edge of the silicon oxide film buried in the trench upon removing the multilayered film. Therefore, the trench element isolation structure is wider than the trench width by the side wall thickness in the semiconductor substrate.

In removing the multilayered film or in subsequent cleaning, the side wall is removed before the silicon oxide film filling the trench is removed. Accordingly, the side wall serves as a protective film to prevent formation of the above-described recess at the element isolation end.

However, even if the side wall is formed of the silicon oxide film to widen the trench element isolation structure, as described above, the silicon oxide film forming the side wall does not satisfactorily function as a protective film against etching or cleaning.

More specifically, in the above methods, the silicon oxide film formed by CVD is used as a sidewall. Hot phosphoric acid is employed in order to remove a silicon nitride film generally used as a trench formation mask film, but the silicon oxide film formed by CVD cannot attain a sufficiently high etching selectivity with respect to the silicon nitride film.

Similarly, the side wall made of the silicon oxide film cannot sufficiently protect the silicon oxide film filling the trench from subsequent cleaning.

In, therefore, removing the silicon nitride film with hot phosphoric acid, or performing etching or cleaning later, the side wall is entirely removed to form a recess at the boundary between the silicon oxide film filling the trench and the semiconductor substrate.

When the gate electrode of a MOS transistor is formed over the recess, an electric field concentrates at the element isolation end of the trench element isolation structure, resulting in a low threshold voltage and a large leakage current of the transistor.

SUMMARY OF THE INVENTION

The present invention solves this problem, and provides a semiconductor device having a trench element isolation structure having good electrical characteristics and high reliability by relaxing concentration of an electric field at an element isolation end, and a method of manufacturing the same.

A semiconductor device according to the present invention comprises a trench formed in a semiconductor substrate, and an insulating film filling the trench, the trench having a side wall constituted by an upper inclined surface making a predetermined angle with a surface of the semiconductor substrate, and a lower surface substantially perpendicular to the surface of the semiconductor substrate, and having a flat bottom surface.

Another aspect of the semiconductor device according to the present invention comprises a trench element isolation structure formed by an insulating film filling a trench in a semiconductor substrate, the insulating film projecting from a surface of the semiconductor substrate, and having a side edge on the semiconductor substrate which is covered with a thermal oxide film formed by thermally oxidizing a polysilicon film.

A method of manufacturing a semiconductor device according to the present invention comprises the first step of forming a first insulating film on a semiconductor substrate, the second step of selectively removing the first insulating film to partially expose the semiconductor substrate, the third step of removing the semiconductor substrate exposed conforming to a shape of the first insulating film, thereby forming a first trench having a side wall formed by an inclined surface making a predetermined angle with a surface of the semiconductor substrate, the fourth step of forming a second insulating film to cover an inner wall surface of the first trench including the inclined surface, the fifth step of removing the second insulating film from a bottom surface of the first trench to expose the semiconductor substrate on the bottom surface of the first trench, the sixth step of removing the semiconductor substrate exposed on the bottom surface of the first trench, thereby forming a second trench which continues from a side wall of the first trench and has a side wall substantially perpendicular to the surface of the semiconductor substrate, the seventh step of forming a third insulating film on an entire surface including inner surfaces of the first and second trenches, thereby filling the first and second trenches, the eighth step of removing the third insulating film until the first insulating film is exposed, and the ninth step of removing the first insulating film.

Another aspect of the method of manufacturing a semiconductor device according to the present invention comprises the first step of forming a first insulating film on a semiconductor substrate, the second step of forming a second insulating film on the first insulating film, the third step of selectively removing the second insulating film to form an opening through which the first insulating film is exposed, the fourth step of forming an oxidizable film on an entire surface of the semiconductor substrate, the fifth step of removing the oxidizable film until the first insulating film is exposed in the opening, thereby forming a first side wall made of the oxidizable film at a side wall of the second insulating film in the opening, the sixth step of forming a third insulating film on the entire surface of the semiconductor substrate, the seventh step of removing the third insulating film until the semiconductor substrate is exposed in the opening, thereby forming a second side wall made of the third insulating film so as to cover the first side wall, the eighth step of removing the semiconductor substrate exposed in the opening by using the second insulating film and the second side wall as a mask, thereby forming a trench in the semiconductor substrate, the ninth step of forming a fourth insulating film on the entire surface of the semiconductor substrate to fill the trench, the 10th step of removing the fourth insulating film until the second insulating film is exposed, the 11th step of removing the first and second insulating films to expose the underlying semiconductor substrate, and the 12th step of heat-treating the semiconductor substrate to thermally oxidize the first side wall made of the oxidizable film.

Still another aspect of the method of manufacturing a semiconductor device according to the present invention comprises the first step of forming a first insulating film on a semiconductor substrate, the second step of selectively removing the first insulating film to form an opening through which the semiconductor substrate is exposed, the third step of forming an oxidizable film on an entire surface of the semiconductor substrate, the fourth step of heat-treating the semiconductor substrate to form a thermal oxide film of the oxidizable film, the fifth step of removing the thermal oxide film on the first insulating film to form a side wall made of the thermal oxide film at a side wall of the first insulating film in the opening, the sixth step of removing the semiconductor substrate exposed in the opening by using the first insulating film and the side wall as a mask, thereby forming a trench in the semiconductor substrate, the seventh step of forming a second insulating film on an entire surface of the semiconductor substrate to fill the trench, the eighth step of removing the second insulating film until the first insulating film is exposed, and the ninth step of removing the first insulating film to expose the underlying semiconductor substrate.

Still another aspect of the method of manufacturing a semiconductor device according to the present invention comprises the first step of forming a first insulating film on a semiconductor substrate, the second step of forming a second insulating film on the first insulating film, the third step of selectively removing the second insulating film to form an opening through which the first insulating film is exposed, the fourth step of forming an oxidizable film on an entire surface of the semiconductor substrate, the fifth step of removing the oxidizable film until the first insulating film is exposed in the opening, thereby forming a first side wall made of the oxidizable film at a side wall of the second insulating film in the opening, the sixth step of forming a third insulating film on the entire surface of the semiconductor substrate, the seventh step of removing the third insulating film and the first insulating film until the semiconductor substrate is exposed in the opening, thereby forming a second side wall made of the third insulating film so as to cover the first side wall, the eighth step of removing the semiconductor substrate exposed in the opening by using the second insulating film and the second side wall as a mask, thereby forming a first trench having a side wall formed by an inclined surface making a predetermined angle with the surface of the semiconductor substrate, the ninth step of forming a fourth insulating film on an inner wall surface of the first trench including the inclined surface, the 10th step of removing the fourth insulating film from a bottom surface of the first trench, thereby exposing the semiconductor substrate on the bottom surface of the first trench, the 11th step of removing the semiconductor substrate exposed on the bottom surface of the first trench, thereby forming a second trench which continues from a side wall of the first trench and has a side wall substantially perpendicular to the surface of the semiconductor substrate, the 12th step of forming a fifth insulating film on an entire surface including inner surfaces of the first and second trenches, thereby filling the first and second trenches, the 13th step of removing the fifth insulating film until the second insulating film is exposed, the 14th step of removing the first and second insulating films to expose the underlying semiconductor substrate, and the 15th step of heat-treating the semiconductor substrate to thermally oxidize the first side wall made of the oxidizable film.

Still another aspect of the method of manufacturing a semiconductor device according to the present invention comprises the first step of forming a first insulating film on a semiconductor substrate, the second step of selectively removing the first insulating film to form an opening through which the semiconductor substrate is exposed, the third step of forming an oxidizable film on an entire surface of the semiconductor substrate, the fourth step of heat-treating the semiconductor substrate to form a thermal oxide film of the oxidizable film, the fifth step of removing the thermal oxide film until the surface of the semiconductor substrate is exposed in the opening, thereby forming a side wall made of the thermal oxide film at side walls of the first and second insulating films in the opening, the sixth step of removing the semiconductor substrate exposed in the opening by using the first insulating film and the side wall as a mask, thereby forming a first trench having a side wall formed by an inclined surface making a predetermined angle with the surface of the semiconductor substrate, the seventh step of forming a second insulating film on an inner wall surface of the first trench including the inclined surface, the eighth step of removing the second insulating film from a bottom surface of the first trench to expose the semiconductor substrate on the bottom surface of the first trench, the ninth step of removing the semiconductor substrate exposed on the bottom surface of the first trench, thereby forming a second trench which continues from a side wall of the first trench and has a side wall substantially perpendicular to semiconductor substrate surface, the 10th step of forming a third insulating film on an entire surface including inner surfaces of the first and second trenches, thereby filling the first and second trenches, the 11th step of removing the third insulating film until the first insulating film is exposed, and the 12th step of removing the first insulating film.

In the present invention, after a first trench having a side wall formed by a uniformly inclined surface is formed in a semiconductor substrate, etching is performed while only this inclined surface is covered with a second insulating film, thereby removing the semiconductor substrate exposed on the bottom surface and forming a second trench. Accordingly, a trench whose upper half portion is constructed by the uniformly inclined surface making a predetermined angle with semiconductor substrate surface, and lower half portion is constructed by the substantially vertical side wall can be formed with high controllability.

If dry etching is performed in preferably a chlorine atmosphere or an atmosphere mixture of hydrogen bromide and chlorine in forming the first trench, the side wall of the first trench can stably form an inclined surface. When dry etching is performed in an atmosphere mixture of hydrogen bromide and oxygen in forming the second trench, the side wall of the second trench can be formed into a surface almost perpendicular to semiconductor substrate surface.

In this manner, by forming a uniformly inclined surface at the upper end of the trench side wall, the inclined surface formed with high controllability can disperse even an electric field generated at the end of the element isolation region and can relax concentration of an electric field.

Since the lower half portion of the trench side wall is formed perpendicular to semiconductor substrate surface, the trench can be made sufficiently deep. Therefore, elements can be reliably isolated.

Further, in the present invention, in forming a trench element isolation structure, a trench is formed in the semiconductor substrate using, as a mask, a mask film having an opening and a second side wall covering an oxidizable film (first side wall) formed on the side wall of the opening. The trench is filled with an insulating film, and then the mask film is removed. As a result, the oxidizable film can be left via the second side wall at the side edge of the insulating film filling the trench on the semiconductor substrate. By thermally oxidizing the oxidizable film, the side edge of the insulating film filling the trench can be covered with and protected by the thermal oxide film.

In the present invention, in forming a trench element isolation structure, a trench is formed in the semiconductor substrate using, as a mask, a mask film having an opening and a side wall made of a thermal oxide film formed in the opening. The trench is filled with an insulating film, and then the mask film is removed. With this processing, the side edge of the insulating film filling the trench can be covered with and protected by the thermal oxide film on the semiconductor substrate.

In this case, the oxidizable film is preferably a polysilicon film. A thermal oxide film formed by thermally oxidizing the polysilicon film has an etching rate ⅙ smaller than that of a silicon oxide film formed by CVD method, so is hardly removed by etching, cleaning, and the like. In removing the mask film or performing subsequent etching or cleaning, the thermal oxide film functions as a protective film to prevent the insulating film in the trench from being removed.

According to the present invention, in a semiconductor device having a trench element isolation structure, concentration of an electric field at an element isolation end can be relaxed. Therefore, a semiconductor device having good electrical characteristics and high reliability, and a method of manufacturing the same can be provided.

DETAILED DESCRIPTION OF THE PREFERRED EMBODIMENTS

First Embodiment

The structure and manufacturing method of an nMOS transistor to which a trench element isolation structure according to the present invention is applied will be described with reference to FIGS. 1A to 5B.

As shown in FIG. 1A, the surface of a p-type silicon semiconductor substrate 1 is thermally oxidized to form a thermal oxide film 2 having a thickness of about 300 Å. On the thermal oxide film 2, a silicon nitride film 3 having a thickness of about 2,000 Å is formed by low pressure CVD method.

As shown in FIG. 1B, the silicon nitride film 3 and the thermal oxide film 2 are removed by photolithography and subsequent dry etching to form an opening 26 so as to expose the p-type silicon semiconductor substrate 1 in an element isolation region.

Figure 1:
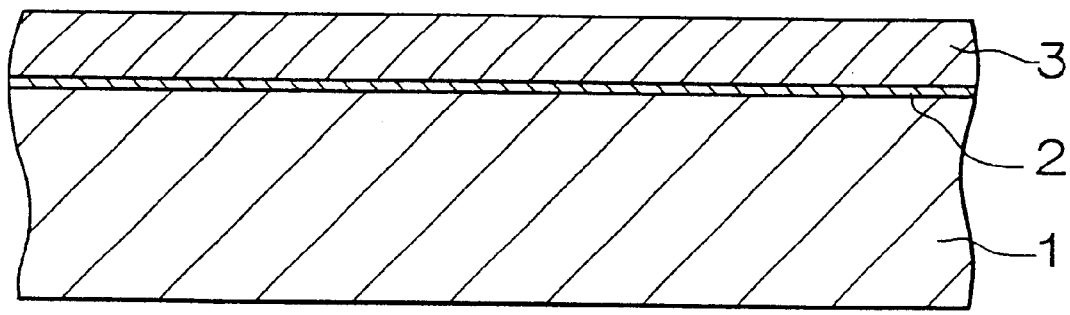
FIGS. 1A to 1D are schematic sectional views, respectively, showing the steps in manufacturing an nMOS transistor according to the first embodiment.
Figure 1:
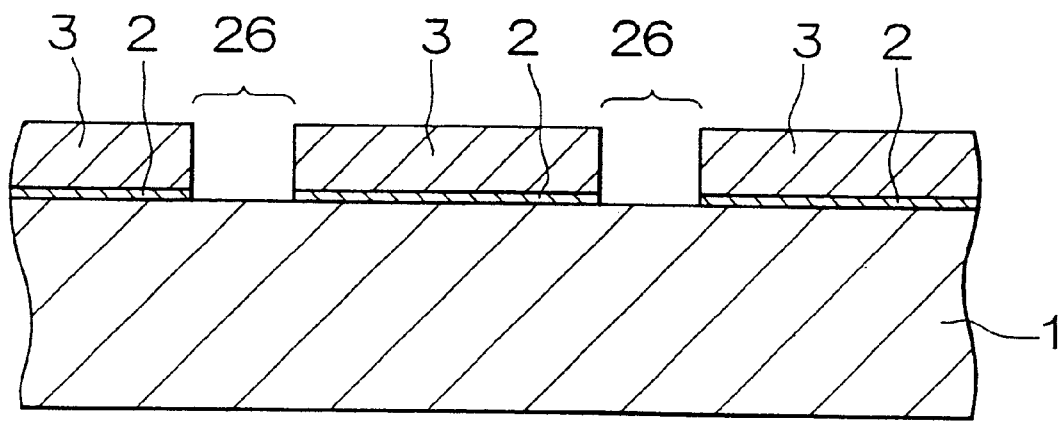
Figure 1C:
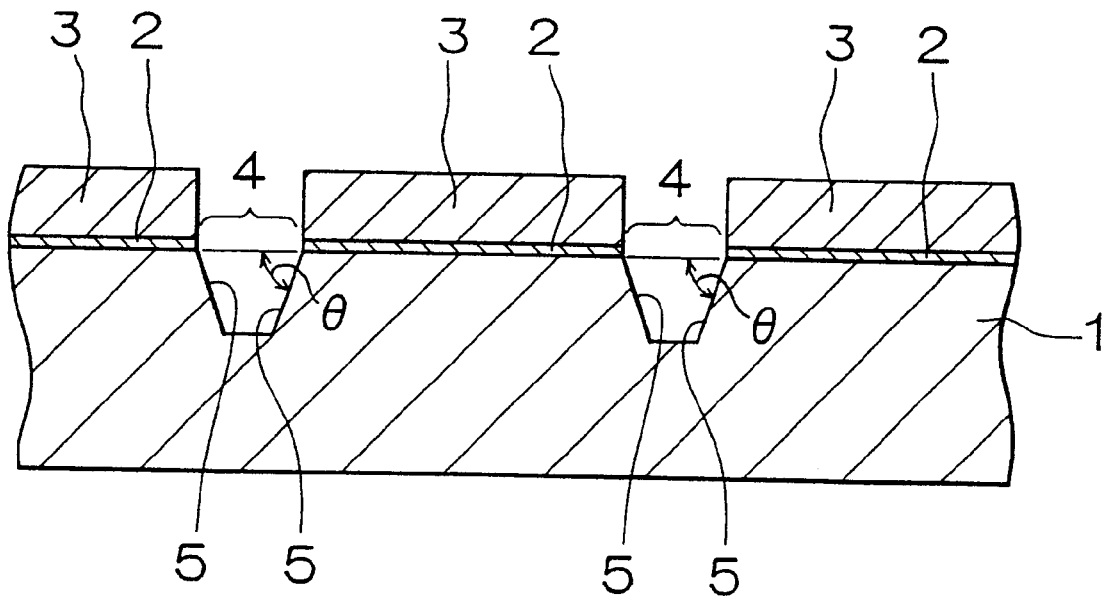

As shown in FIG. 1C, dry etching is performed in a chlorine ($Cl_2$) atmosphere using the silicon nitride film 3 as a mask to remove the p-type silicon semiconductor substrate 1 from the opening 26 and to form a first trench 4 approximately 2,000 Å wide.

In forming the first trench 4, dry etching may be performed in an atmosphere mixture of hydrogen bromide (HBr) and chlorine instead of a chlorine atmosphere.

By dry etching under these conditions, a uniformly inclined surface 5 making an angle (θ) around 70° with the surface of the p-type silicon semiconductor substrate 1 can be formed as the side wall of the first trench 4, as shown in FIG. 1C.

By forming the inclined surface 5 in the first trench 4 and isolating elements, even an electric field generated near the inclined surface 5 on the p-type silicon semiconductor substrate 1 can be dispersed stepwise in the direction of depth along the inclined surface.

Additionally, since an inclined surface 5 having a predetermined angle can be formed by the above dry etching at high precision, concentration of an electric field can be effectively relaxed. An inclined surface angle (θ) smaller than 60° requires an unnecessarily large trench width while an angle larger than 70° enhances concentration of an electric field. Consequently, by setting the inclined surface angle (θ) within the range of 60° to 70°, an optimal structure wherein elements can be micropatterned and concentration of an electric field is suppressed can be obtained.

If the angle (θ) of the inclined surface 5 is set to 70° or more, a kink current is generated to increase the deterioration degree of the electrical characteristics of a MOS transistor in the drain current vs. the gate voltage ($I_d$–$V_g$) graph of the MOS transistor. By setting the angle (θ) of the inclined surface 5 to 70° or less, as in this embodiment, a MOS transistor exhibiting good $I_d$–$V_g$ characteristics by preventing generation of the kink current can be formed.

When the first trench 4 and the inclined surface 5 respectively have a depth of about 2,000 Å and an angle of 60° or more, the side wall of the first trench 4 can ensure a horizontal distance of 0.2 μm or more. Accordingly, concentration of an electric field is relaxed to suppress leakage. In addition, if the horizontal jut of the inclined surface 5 is minimized, the element isolation area can be reduced.

Figure 1D:
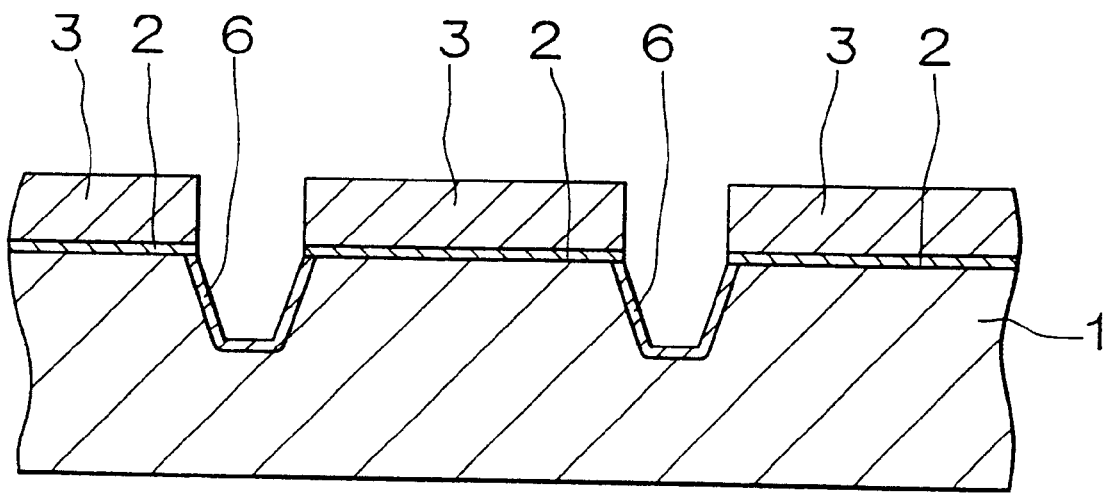

As shown in FIG. 1D, a thermal oxide film 6 about 500 Å thick is formed by thermal oxidation in the surface region of the p-type silicon semiconductor substrate 1 exposed on the inner wall surface of the first trench 4.

Figure 2A:
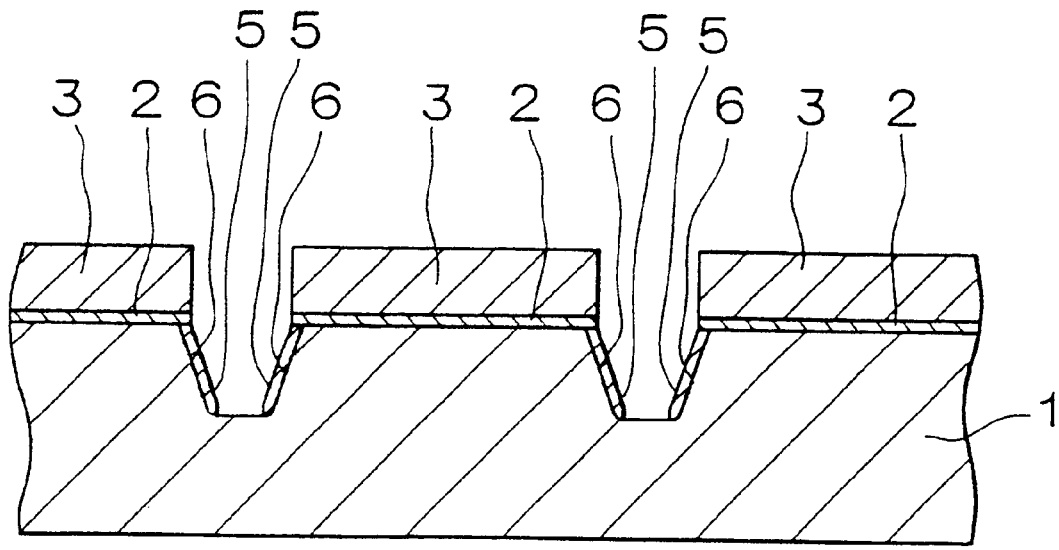
FIGS. 2A to 2D are schematic sectional views, respectively, showing the steps in manufacturing an nMOS transistor according to the first embodiment.

As shown in FIG. 2A, the thermal oxide film 6 is removed from only the bottom surface of the first trench 4. In this case, only the thermal oxide film 6 formed on the bottom surface of the first trench 4 can be removed by anisotropic etching. The thermal oxide film 6 is therefore left on the inclined surface 5 serving as the side wall of the first trench 4, and covers the surface of the p-type silicon semiconductor substrate 1.

Figure 2B:
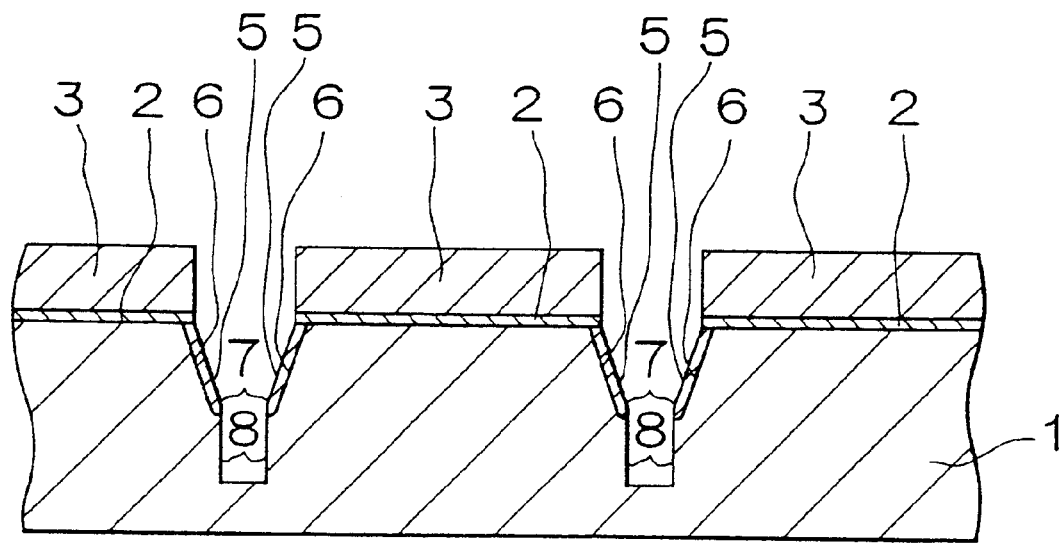

As shown in FIG. 2B, a second trench 7 extending from the first trench 4 in the direction of depth is formed by dry etching in an atmosphere mixture of hydrogen bromide (HBr) and oxygen ($O_2$) using the silicon nitride film 3 and the thermal oxide film 6 remaining on the inclined surface 5 as a mask.

In this dry etching, an appropriate gas flow rate of hydrogen bromide and oxygen is HBr:$O_2$=20:1 to 200:1.

By dry etching under these conditions, a side wall 8 of the second trench 7 is formed at an angle of about 80° to 90° with respect to the surface of the p-type silicon semiconductor substrate 1.

Since the side wall 8 is formed nearly perpendicular to the surface of the p-type silicon semiconductor substrate 1, the trench width of the second trench 7 is kept constant independently of the depth. Hence, elements can be reliably isolated by deepening the second trench 7.

In this case, the second trench 7 is preferably about 2,000 Å deep. The total depth of the trench including the depth of the first trench 4 is in the neighborhood of 4,000 Å from the surface of the p-type silicon semiconductor substrate 1.

Figure 2C:
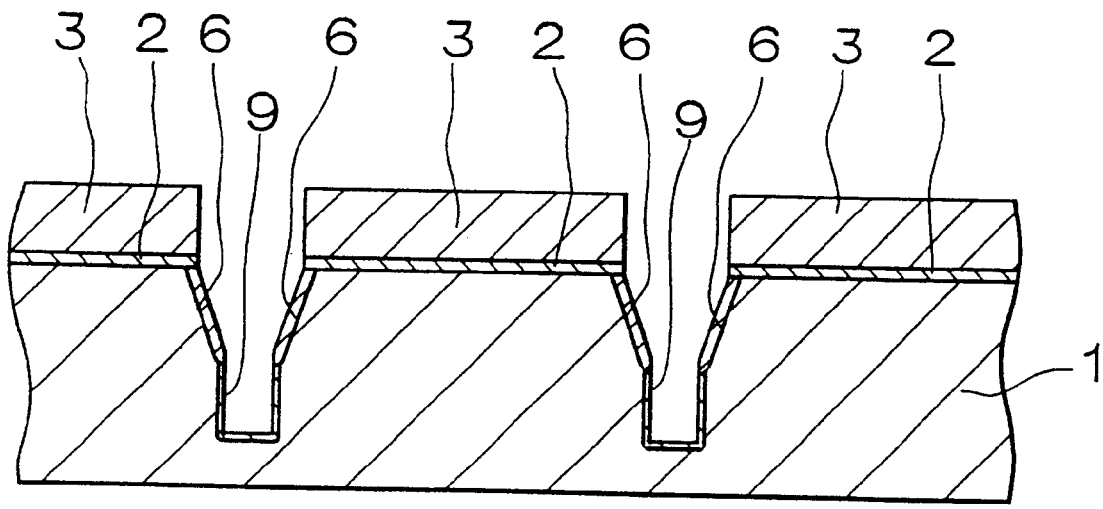

As shown in FIG. 2C, a thermal oxide film 9 having a thickness of about 200 Å is formed by thermally oxidizing the surface region of the p-type silicon semiconductor substrate 1 exposed on the inner wall surface of the second trench 7. This thermal oxide film 9 prevents any spread of a damaged layer formed in the inner wall surface region of the second trench 7 by etching.

Figure 2D:
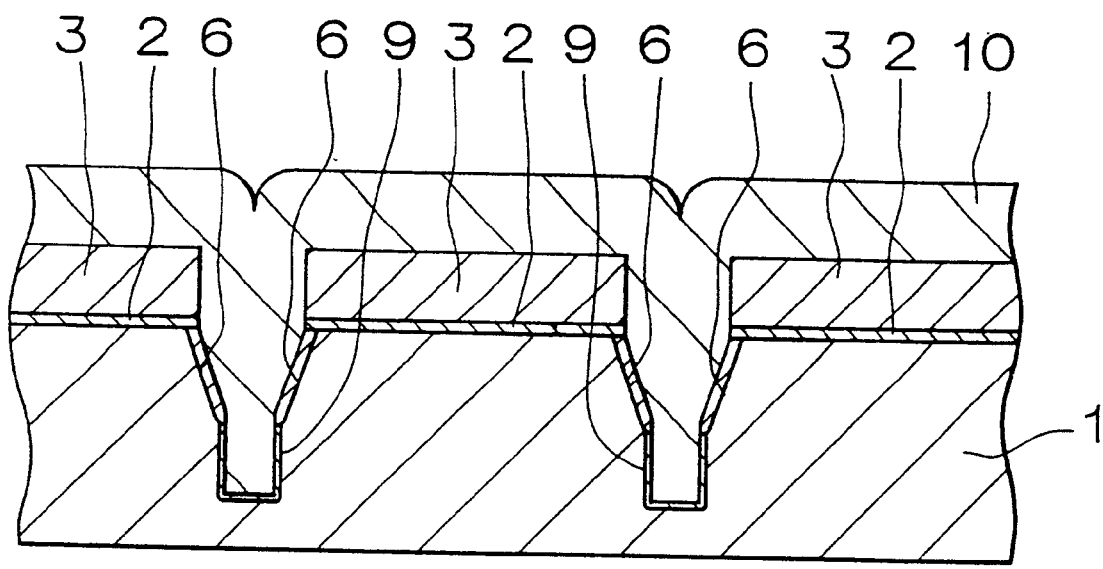

As shown in FIG. 2D, a silicon oxide film 10 having a thickness of about 7,000 Å is formed by low pressure CVD method on the entire surface including the inner surfaces of the first and second trenches 4 and 7. With this processing, the first and second trenches 4 and 7 are completely filled with the silicon oxide film 10.

Figure 3A:
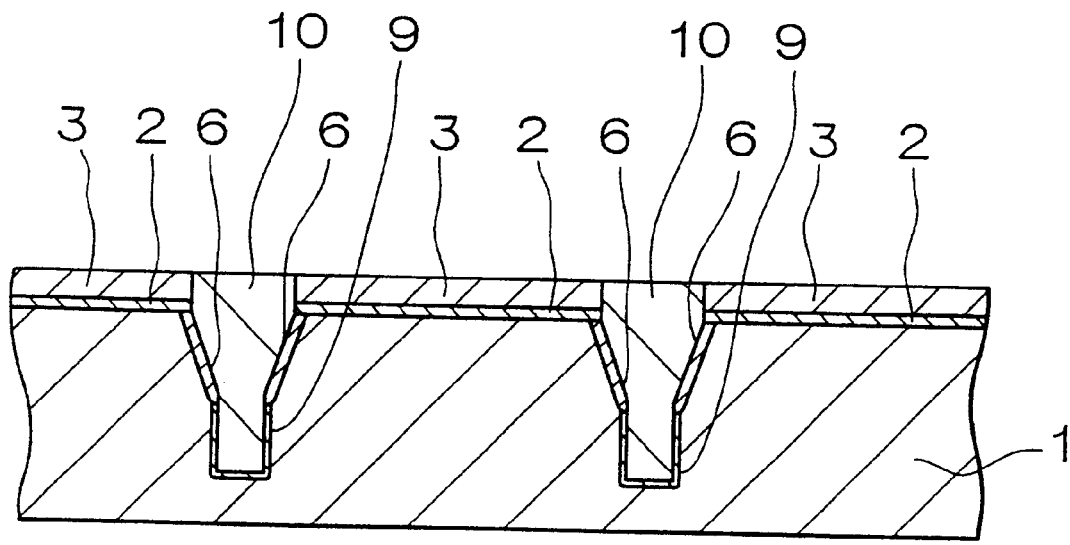
FIGS. 3A to 3D are schematic sectional views, respectively, showing the steps in manufacturing an nMOS transistor according to the first embodiment.

As shown in FIG. 3A, the silicon oxide film 10 is removed by chemical mechanical polishing (CMP) method until the silicon nitride film 3 serving as a stopper is exposed.

Figure 3B:
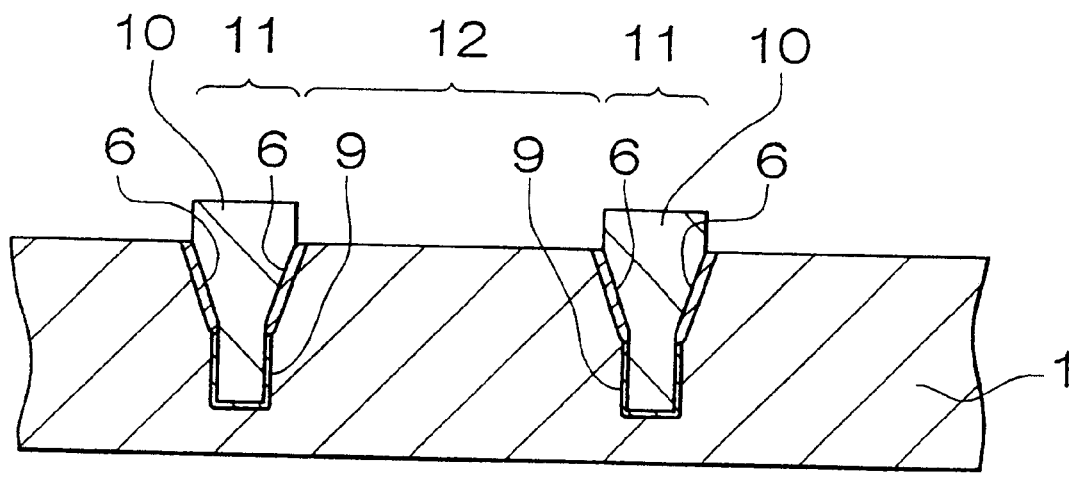

As shown in FIG. 3B, the silicon nitride film 3 is removed by anisotropic dry etching or wet etching. When the silicon oxide film 10 is formed of, e.g., an HTO film highly resistant to wet etching, the silicon nitride film 3 can be removed by wet etching. Subsequently, the thermal oxide film 2 is removed by wet etching using hydrogen fluoride, or dry etching. As a result, the silicon oxide film 10 is left in the first and second trenches 4 and 7 to complete a trench element isolation structure 11. The trench element isolation structure 11 defines an element formation region 12.

Figure 3C:
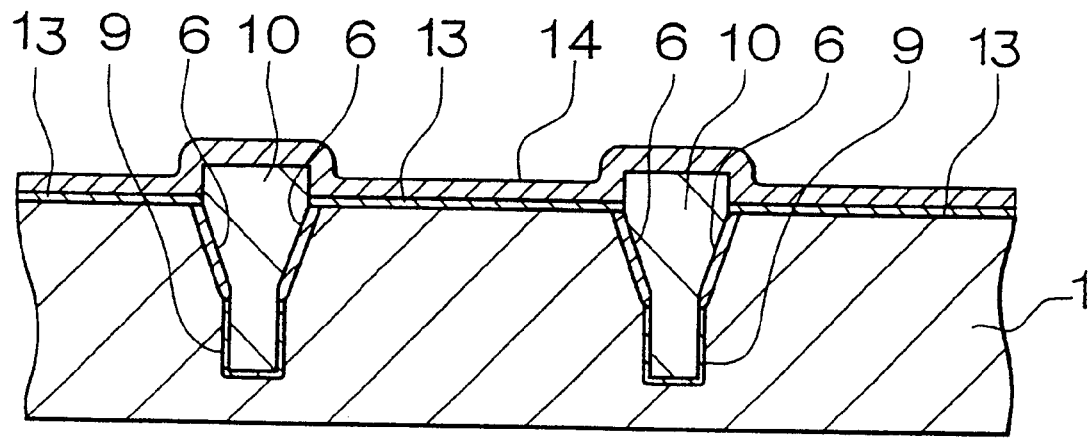

As shown in FIG. 3C, after a thermal oxide film 13 is formed in the element formation region 12 by thermal oxidation, an impurity such as phosphorus (P) is doped in the entire surface by low pressure CVD method to form a conductive polysilicon film 14.

Figure 3D:
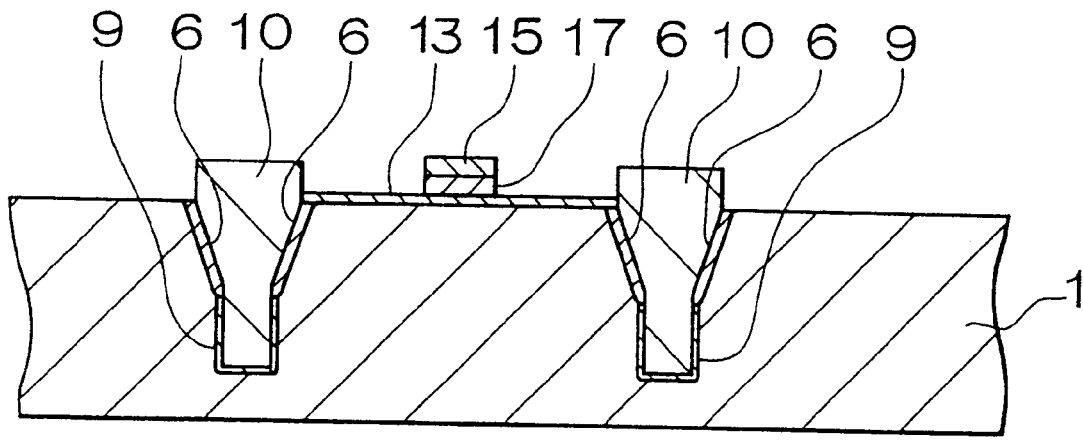

After a silicon oxide film 15 is formed on the polysilicon film 14, the silicon oxide film 15 and the polysilicon film 14 are patterned by photolithography and subsequent dry etching to form a gate electrode 17 made of the polysilicon film 14, as shown in FIG. 3D.

Figure 4A:
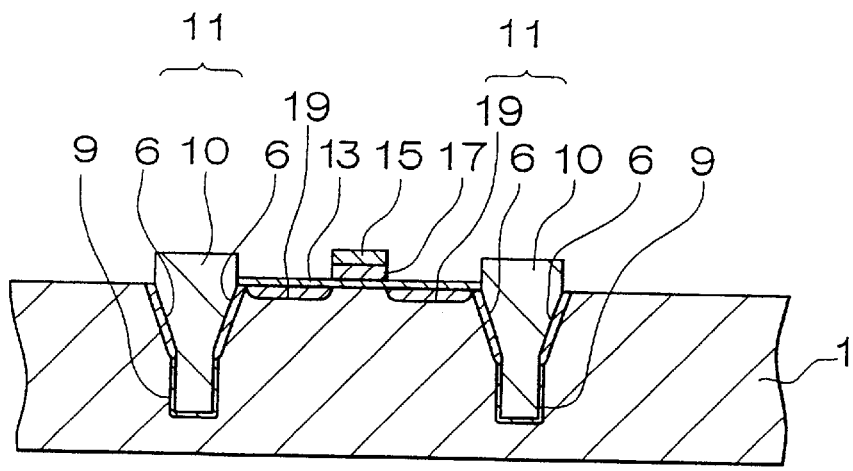
FIGS. 4A to 4C are schematic sectional views, respectively, showing the steps in manufacturing an nMOS transistor according to the first embodiment.

As shown in FIG. 4A, a low-concentration impurity diffusion layer 19 is formed by ion-implanting arsenic (As) as an n-type impurity in the surface region of the p-type silicon semiconductor substrate 1 at a low concentration using the trench element isolation structure 11 and the silicon oxide film 15 as a mask.

Figure 4B:
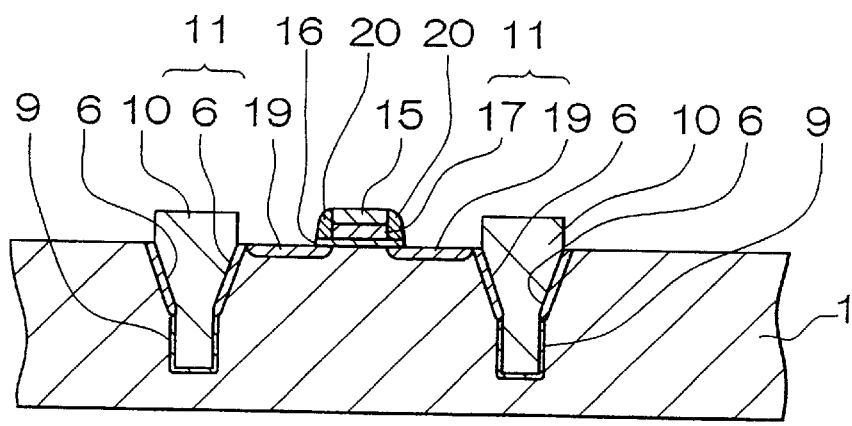

A silicon oxide film is formed on the entire surface by low pressure CVD method. As shown in FIG. 4B, this silicon oxide film is formed into a side wall insulating film 20 on the side surfaces of the gate electrode 17 and the silicon oxide film 15 by photolithography and subsequent anisotropic dry etching. At the same time, the thermal oxide film 13 is removed to remain below the gate electrode 17 and the side wall insulating film 20, thereby forming a gate oxide film 16.

Figure 4C:
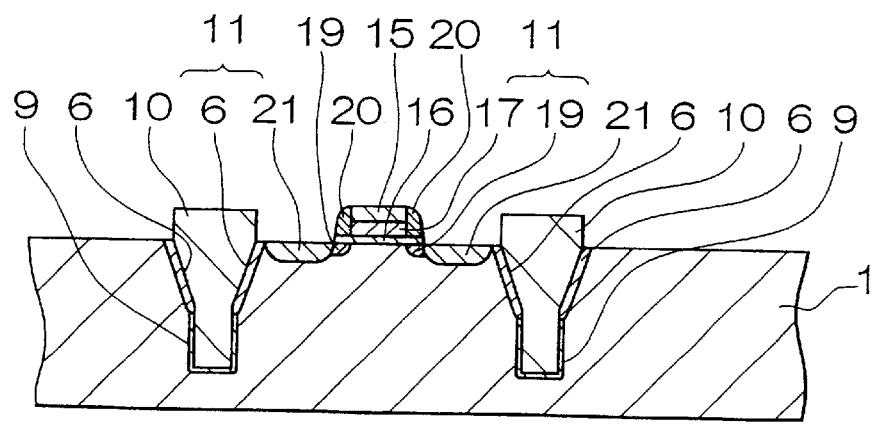

As shown in FIG. 4C, a high-concentration impurity diffusion layer 21 is formed by ion-implanting arsenic (As) or phosphorus (P) as an n-type impurity in the surface region of the p-type silicon semiconductor substrate 1 at a high concentration using the trench element isolation structure 11, the silicon oxide film 15, and the side wall insulating film 20 as a mask. Then, annealing is performed to activate the impurities of the low- and high-concentration impurity diffusion layers 19 and 21.

Figure 5A:
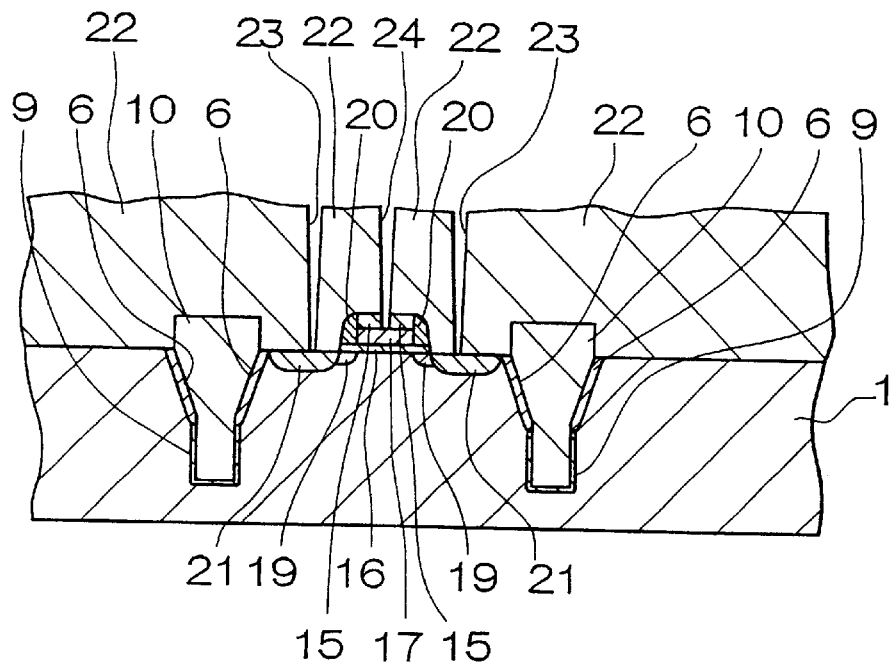
FIGS. 5A and 5B are schematic sectional views, respectively, showing the steps in manufacturing an nMOS transistor according to the first embodiment.

As shown in FIG. 5A, after a BPSG film 22 is deposited thick on the entire surface, reflow is performed. Contact holes 23 and 24 are formed to reach the high-concentration impurity diffusion layer 21 and the gate electrode 17, respectively.

Figure 5B:
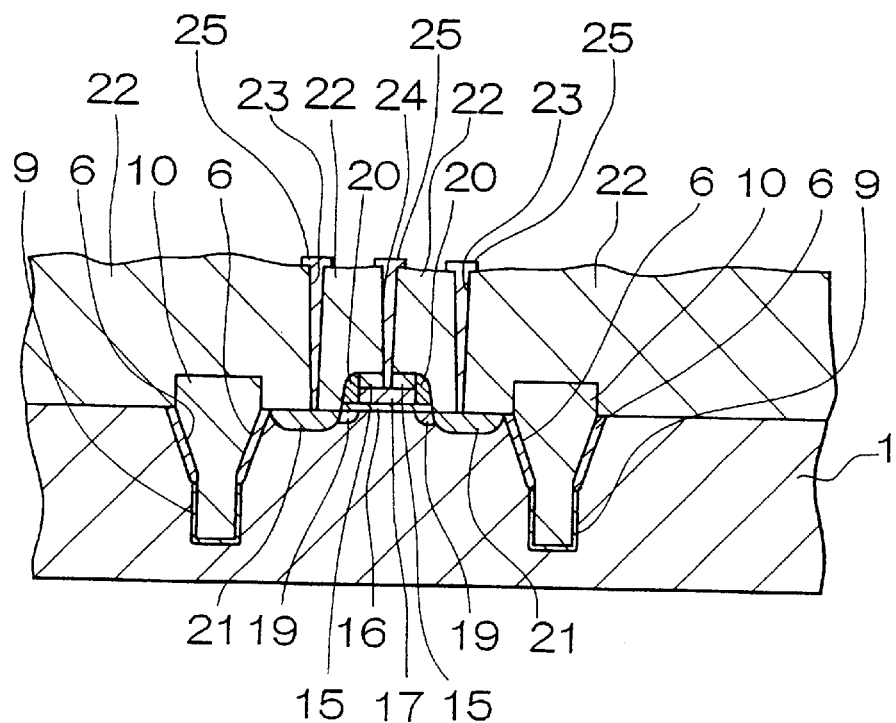

An aluminum wiring layer 25 is sputtered to fill the contact holes 23 and 24, and patterned on the BPSG film 22 to complete an nMOS transistor, as shown in FIG. 5B.

As described above, in this embodiment, the inclined surface 5 can be stably formed on the side wall of the first trench 4 by dry etching in a chlorine atmosphere. This inclined surface 5 can prevent concentration of an electric field near it on the p-type silicon semiconductor substrate 1, and can suppress formation of a parasitic transistor over the trench element isolation structure 11.

The threshold voltage of the nMOS transistor can be kept constant and can be prevented from varying.

The side wall 8 of the second trench 7 can be formed roughly perpendicular to the surface of the p-type silicon semiconductor substrate 1 by dry etching in a mixture atmosphere of hydrogen bromide (HBr) and oxygen. Accordingly, the second trench 7 can be made sufficiently deep, and adjacent element formation regions can be reliably electrically isolated.

An nMOS transistor exhibiting excellent electrical characteristics can be formed in the element formation region 12 defined by the trench element isolation structure 11 having the first and second trenches 4 and 7.

Modification

A modification of the first embodiment will be described. In this modification, oxidization of the inner wall surface of the first trench 4 after formation of the first trench 4 is different in the process of manufacturing an nMOS transistor according to the first embodiment.

Figure 6:
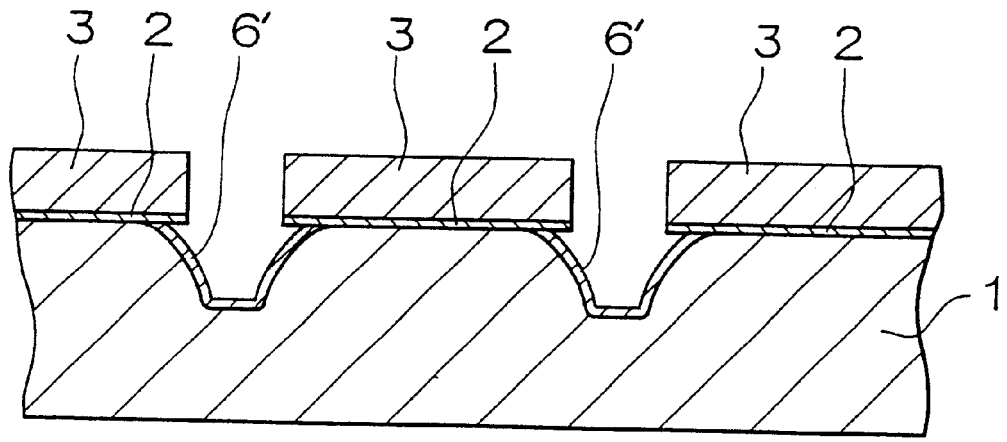
FIG. 6 is a schematic sectional view showing the step in manufacturing an nMOS transistor according to a modification of the first embodiment.

FIG. 6 is a schematic sectional view of a step of this modification corresponding to the step of FIG. 1D in the first embodiment.

In the first embodiment, the thermal oxide film 6 is formed by thermal oxidization after forming the first trench 4. However, in this modification, the first trench 4 is processed to have an inclined shape capable of more effectively relaxing concentration of an electric field by changing the thermal oxidization conditions.

More specifically, after the first trench 4 is formed, its inner wall surface is oxidized in a dilute nitrogen atmosphere at an oxygen concentration of 15% or less and a temperature of 1,000° C. to 1,100° C. for 1 hour or more. With this processing, a thermal oxide film 6' about 150Å thick is formed. At the same time, the upper edge of the inclined surface 5 of the first trench 4 can be rounded, as shown in FIG. 6.

In this manner, by changing only the oxidization conditions, the upper end shape of the inclined surface 5 can be changed into a shape more suitable for relaxing concentration of an electric field. Since the edge of the inclined surface 5 is rounded, an electric field concentrating at the edge on the p-type silicon semiconductor substrate 1 can be relaxed and dispersed along the surface of the rounded edge.

Figure 7:
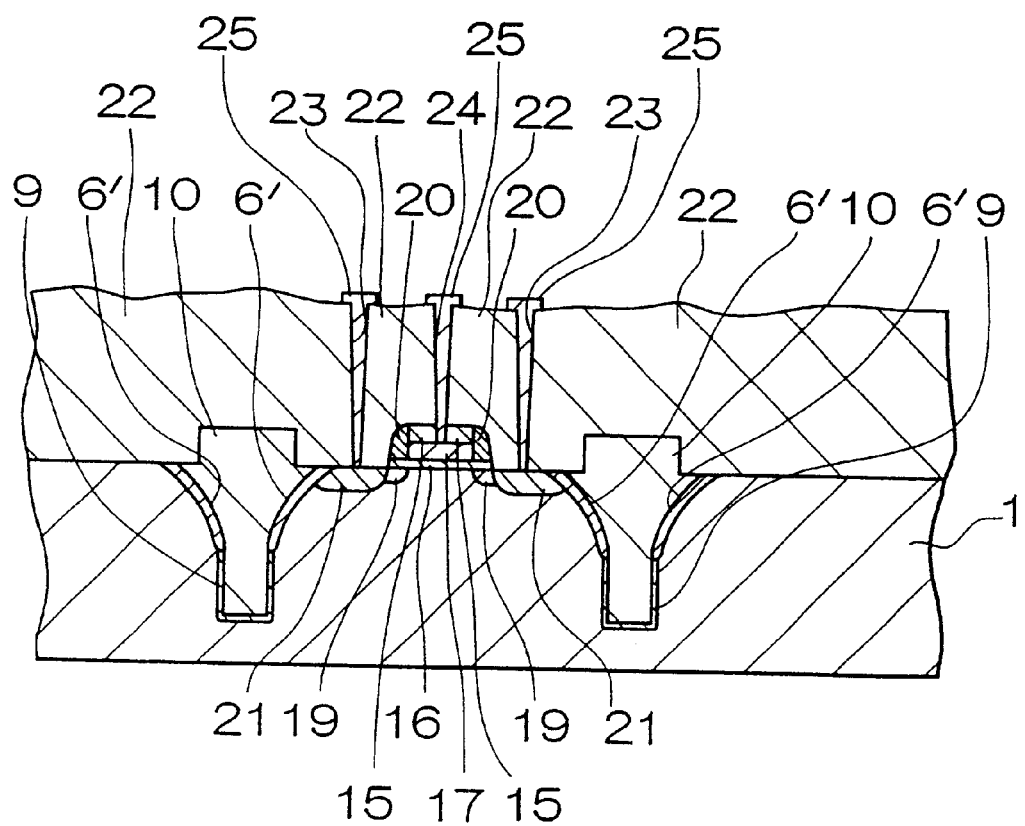
FIG. 7 is a schematic sectional view showing the nMOS transistor according to the modification of the first embodiment.

Subsequently, the same steps as those in the first embodiment are followed to complete an nMOS transistor according to the modification, as shown in FIG. 7.

Second Embodiment

The structure and manufacturing method of an nMOS transistor according to the second embodiment of the present invention will be described with reference to FIGS. 8A to 12. The same reference numerals as in the first embodiment denote the same parts throughout the drawings.

Figure 8A:
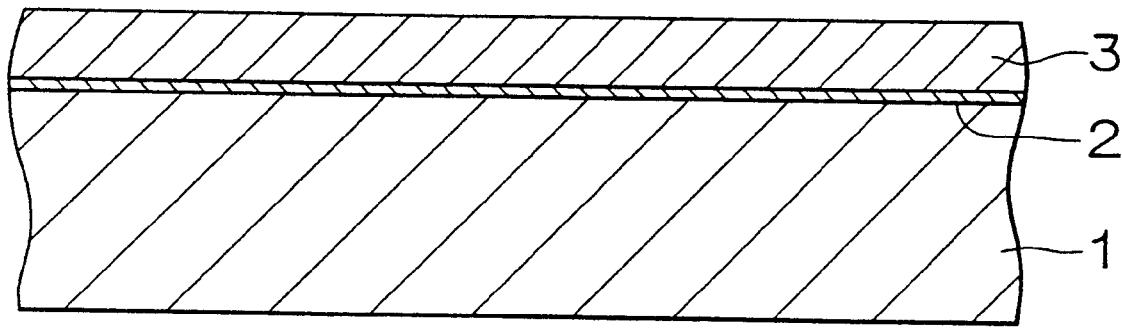
FIGS. 8A to 8D are schematic sectional views, respectively, showing the steps in manufacturing an nMOS transistor according to the second embodiment.

As shown in FIG. 8A, the surface of a p-type silicon semiconductor substrate 1 is thermally oxidized to form a thermal oxide film 2 having a thickness of about 300 Å. On the thermal oxide film 2, a silicon nitride film 3 having a thickness of about 2,000 Å is formed by low pressure CVD method. The thermal oxide film 2 functions as a pad insulating film for relaxing stress generated on the p-type silicon semiconductor substrate 1 and the silicon nitride film 3.

Figure 8B:
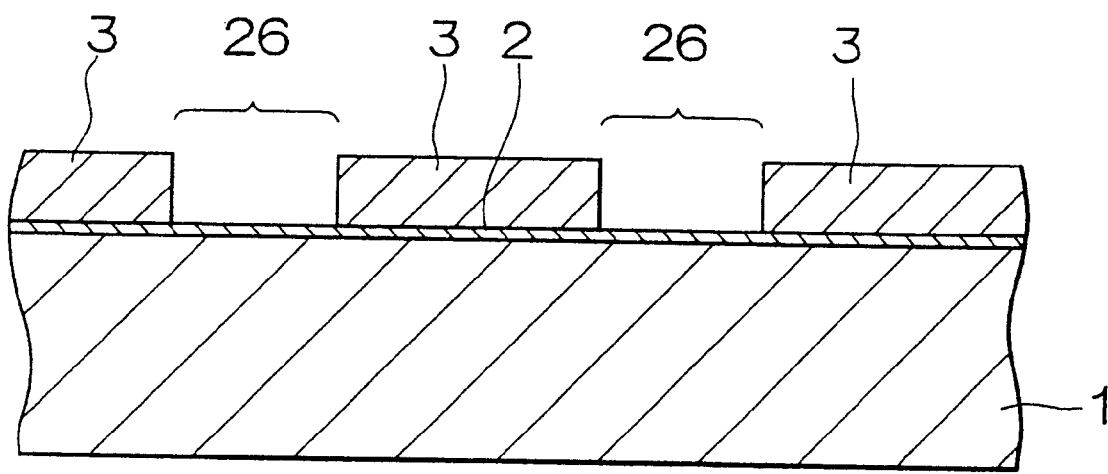

As shown in FIG. 8B, the silicon nitride film 3 is removed by photolithography and subsequent dry etching to form an opening 26 so as to expose the p-type silicon semiconductor substrate 1 in an element isolation region.

Figure 8C:
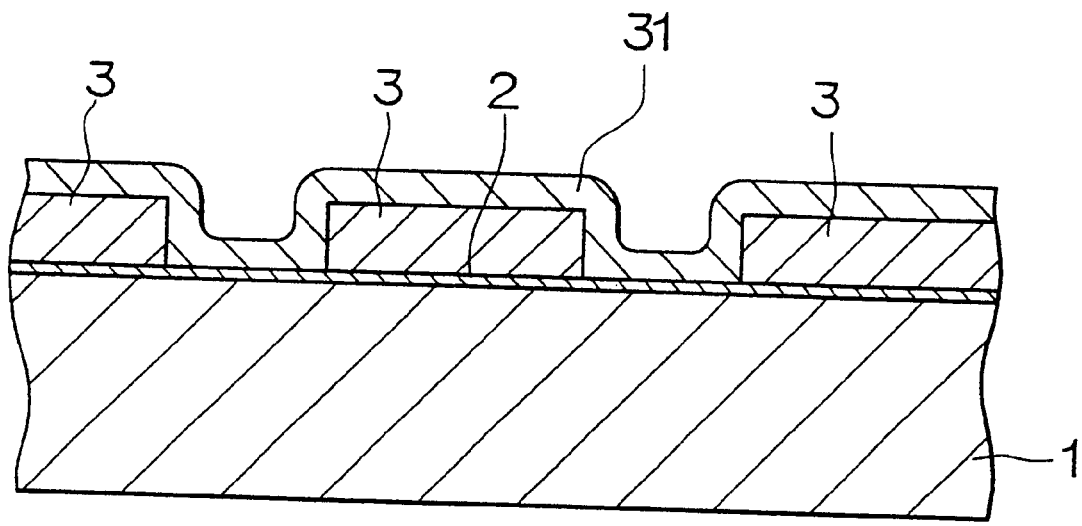

As shown in FIG. 8C, a polysilicon film 31 having a thickness of about 300 Å is formed on the entire surface of the p-type silicon semiconductor substrate 1. Accordingly, the inner wall surface of the opening 26 is covered with the polysilicon film 31.

Figure 8D:
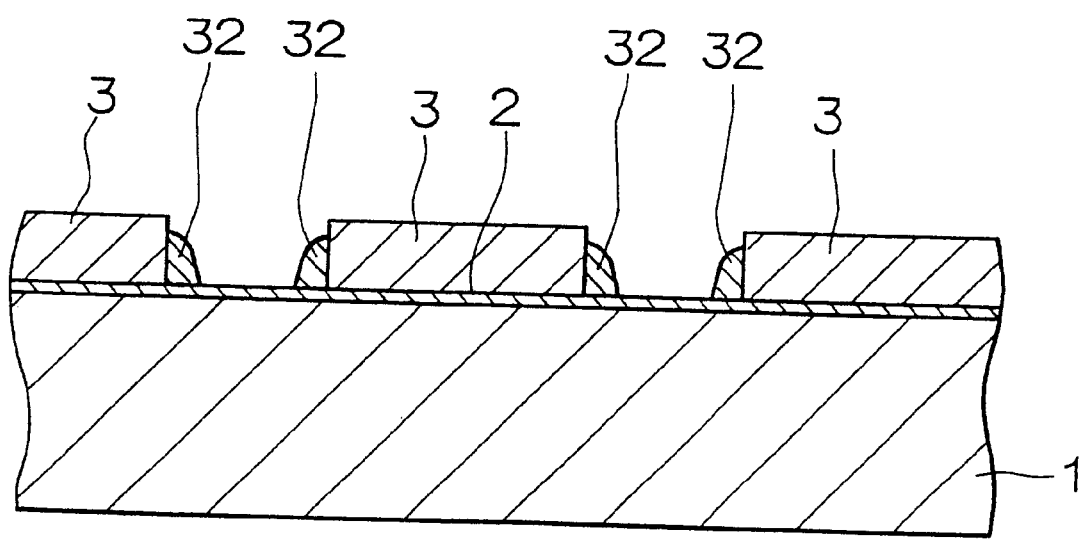

As shown in FIG. 8D, the polysilicon film 31 is removed by anisotropic etching until the thermal oxide film 2 is exposed in the opening 26. That is, anisotropic etching is performed using the thermal oxide film 2 as an etching stopper. As a result, the polysilicon film 31 is left at only the side wall of the silicon nitride film 3 in the opening 26, thereby forming a side wall 32 of the polysilicon film 31.

Figure 9A:
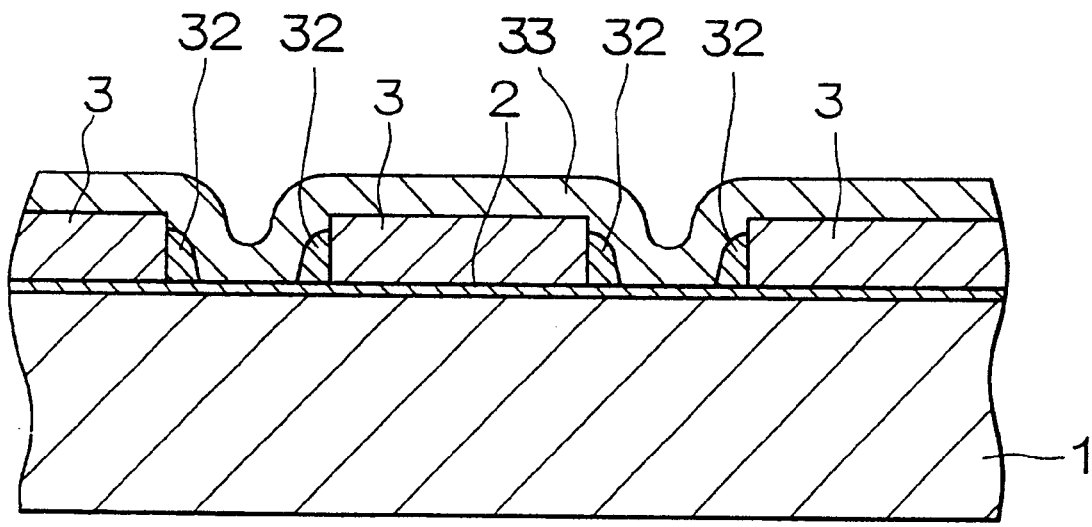
FIGS. 9A to 9D are schematic sectional views, respectively, showing the steps in manufacturing an nMOS transistor according to the second embodiment.

As shown in FIG. 9A, a silicon oxide film 33 is formed by CVD method on the entire surface of the p-type silicon semiconductor substrate 1.

Figure 9B:
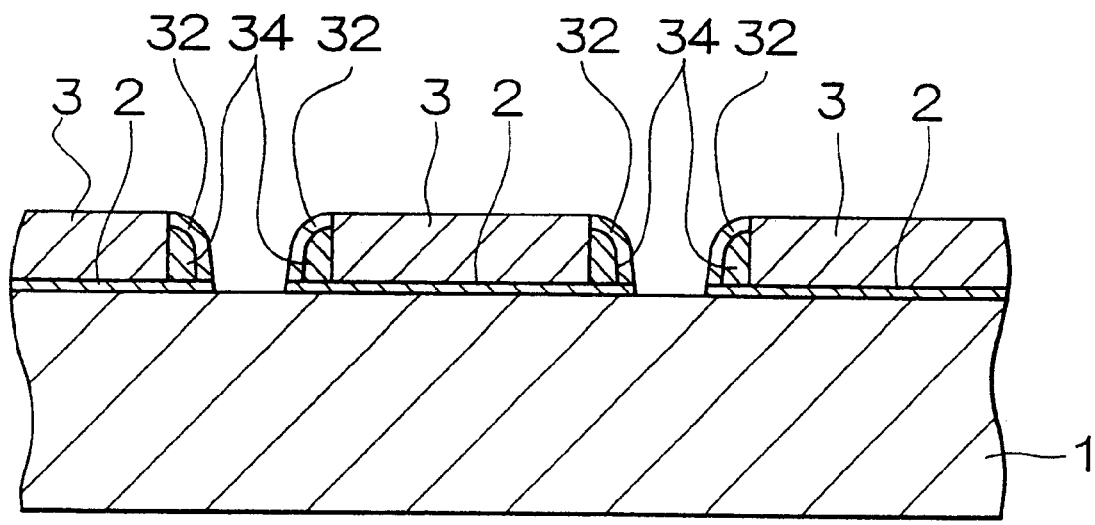

As shown in FIG. 9B, the silicon oxide film 33 is removed by anisotropic etching until the p-type silicon semiconductor substrate 1 is exposed in the opening 26. In other words, anisotropic etching is performed using the p-type silicon semiconductor substrate 1 as an etching stopper. Then, the silicon oxide film 33 is left and covers the side wall 32, forming a side wall 34 of the silicon oxide film 33.

Figure 9C:
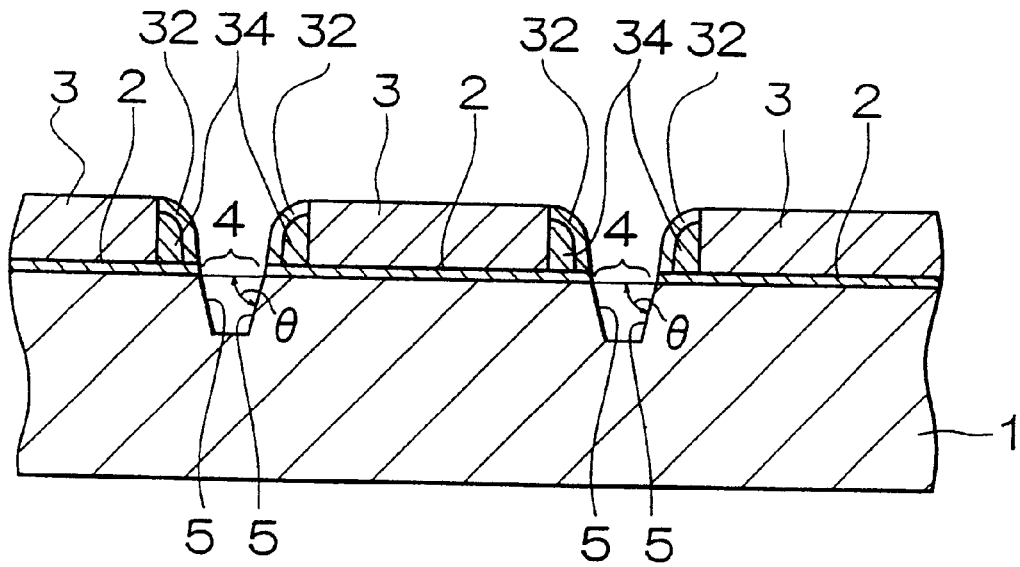

As shown in FIG. 9C, dry etching is performed in a chlorine ($Cl_2$) atmosphere using the silicon nitride film 3 as a mask to remove the p-type silicon semiconductor substrate 1 from the opening 26 and to form a first trench 4 having a depth of about 2,000 Å.

In forming the first trench 4, dry etching may be performed in an atmosphere mixture of hydrogen bromide (HBr) and chlorine instead of a chlorine atmosphere.

By dry etching under these conditions, a uniformly inclined surface 5 making an angle ($\theta$) around 70° with the surface of the p-type silicon semiconductor substrate 1 can be form as the side wall of the first trench 4, as shown in FIG. 9C.

By forming the inclined surface 5 in the first trench 4 and isolating elements, even an electric field generated near the inclined surface 5 on the p-type silicon semiconductor substrate 1 can be dispersed stepwise in the direction of depth along the inclined surface.

Moreover, since an inclined surface 5 having a predetermined angle can be formed by the above dry etching at high precision, concentration of an electric field can be effectively relaxed. An inclined surface angle ($\theta$) smaller than 60° requires an unnecessarily large trench width while an angle larger than 70° enhances concentration of an electric field. Therefore, by setting the inclined surface angle ($\theta$) within the range of 60° to 70°, an optimal structure wherein elements are micropatterned and concentration of an electric field is relaxed can be obtained.

Figure 9D:
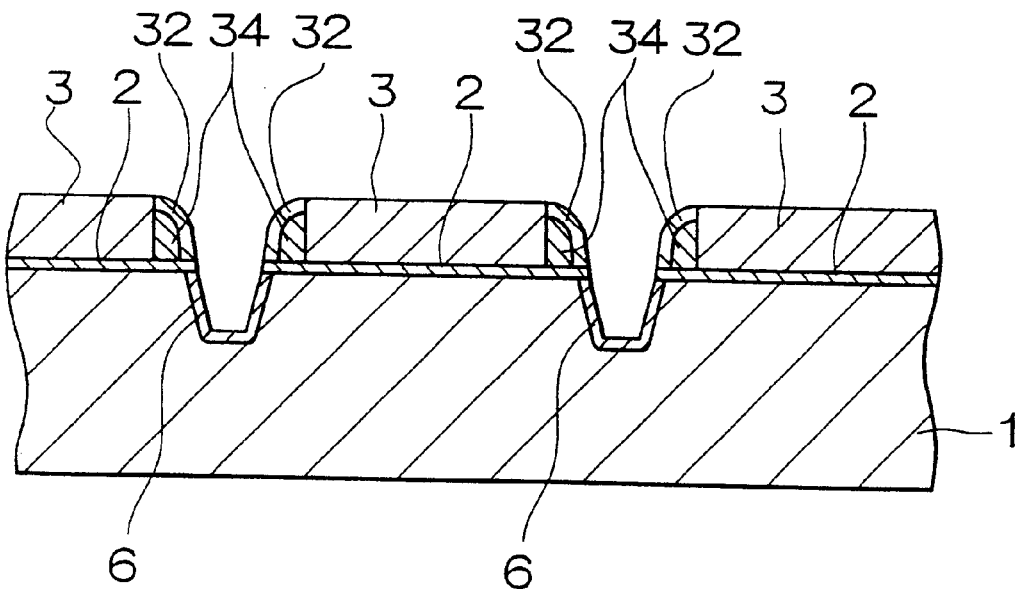

As shown in FIG. 9D, a thermal oxide film 6 having a thickness of about 500 Å is formed by thermal oxidization in the surface region of the p-type silicon semiconductor substrate 1 exposed on the inner wall surface of the first trench 4.

Figure 10A:
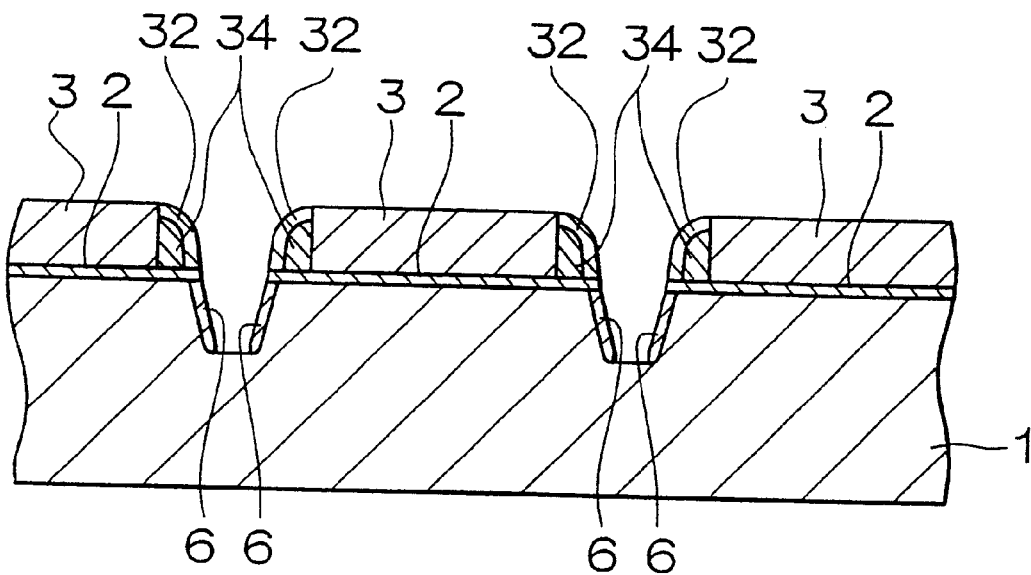
FIGS. 10A to 10D are schematic sectional views, respectively, showing the steps in manufacturing an nMOS transistor according to the second embodiment.

As shown in FIG. 10A, the thermal oxide film 6 is removed from only the bottom surface of the first trench 4. In this case, only the thermal oxide film 6 formed on the bottom surface of the first trench 4 can be removed by anisotropic etching. The thermal oxide film 6 is therefore left on the inclined surface 5 serving as the side wall of the first trench 4, and covers the surface of the p-type silicon semiconductor substrate 1.

Figure 10B:
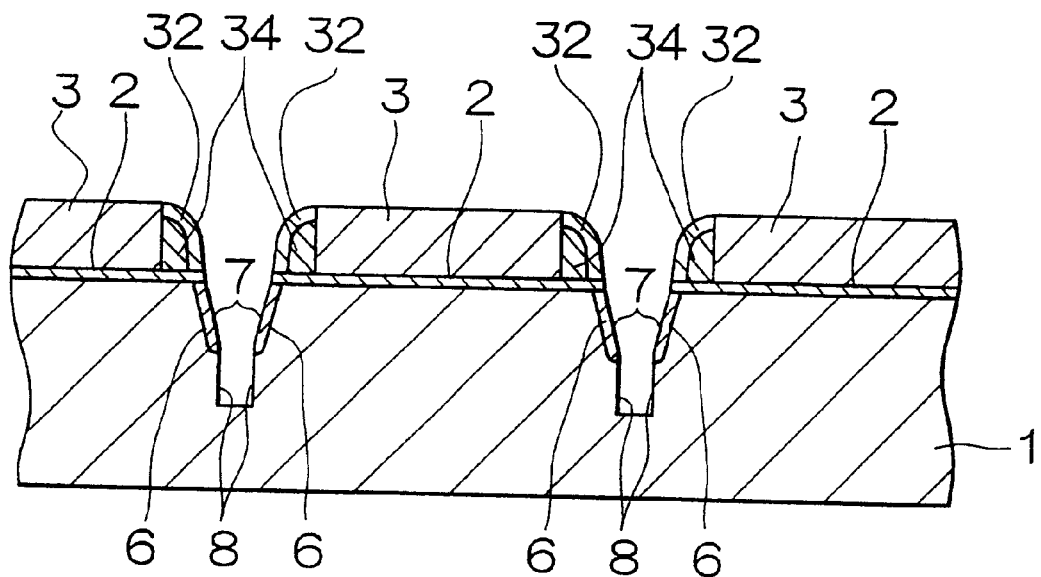

As shown in FIG. 10B, a second trench 7 extending from the first trench 4 in the direction of depth is formed by dry etching in an atmosphere mixture of hydrogen bromide (HBr) and oxygen ($O_2$) using the silicon nitride film 3 and the thermal oxide film 6 left on the inclined surface 5 as a mask.

In this dry etching, an approximate gas flow rate of hydrogen bromide and oxygen is HBr:$O_2$=20:1 to 200:1.

By dry etching under these conditions, a side wall 8 of the second trench 7 is formed at an angle of about 80° to 90° with respect to the surface of the p-type silicon semiconductor substrate 1.

Since the side wall 8 is formed substantially perpendicular to the surface of the p-type silicon semiconductor substrate 1, the trench width of the second trench 7 is kept constant independently of the depth. Therefore, elements can be reliably isolated by satisfactorily deepening the second trench 7.

In this case, the second trench 7 is preferably about 2,000 Å deep. The total depth of the trench including the depth of the first trench 4 is about 4,000 Å from the surface of the p-type silicon semiconductor substrate 1.

Figure 10C:
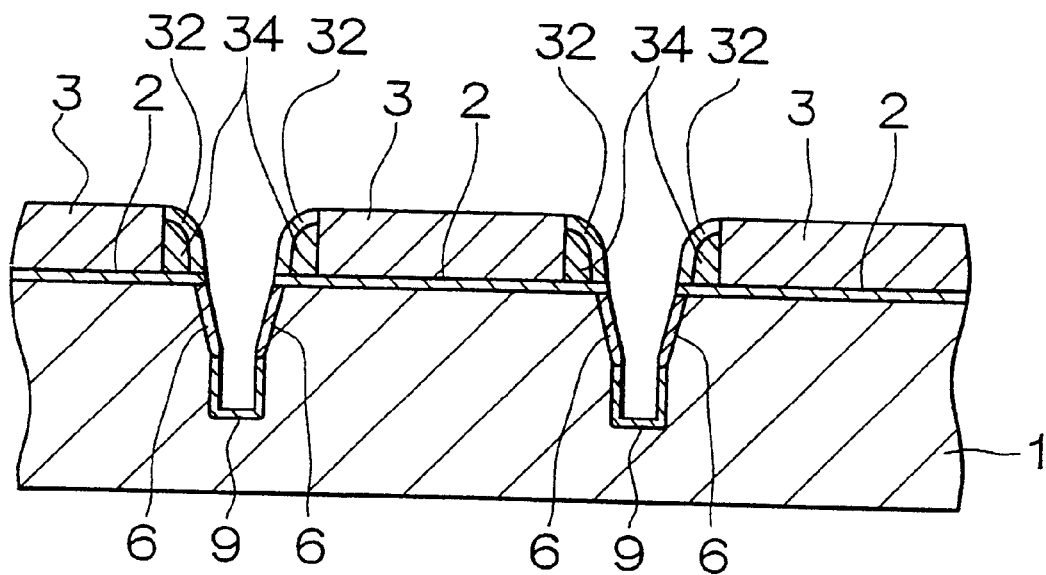

As shown in FIG. 10C, a thermal oxide film 9 having a thickness of about 200 Å is formed by thermally oxidizing the surface region of the p-type silicon semiconductor substrate 1 exposed on the inner wall surface of the second trench 7. This thermal oxide film 9 prevents any spread of a damaged layer formed in the inner wall surface region of the second trench 7 by etching.

Figure 10D:
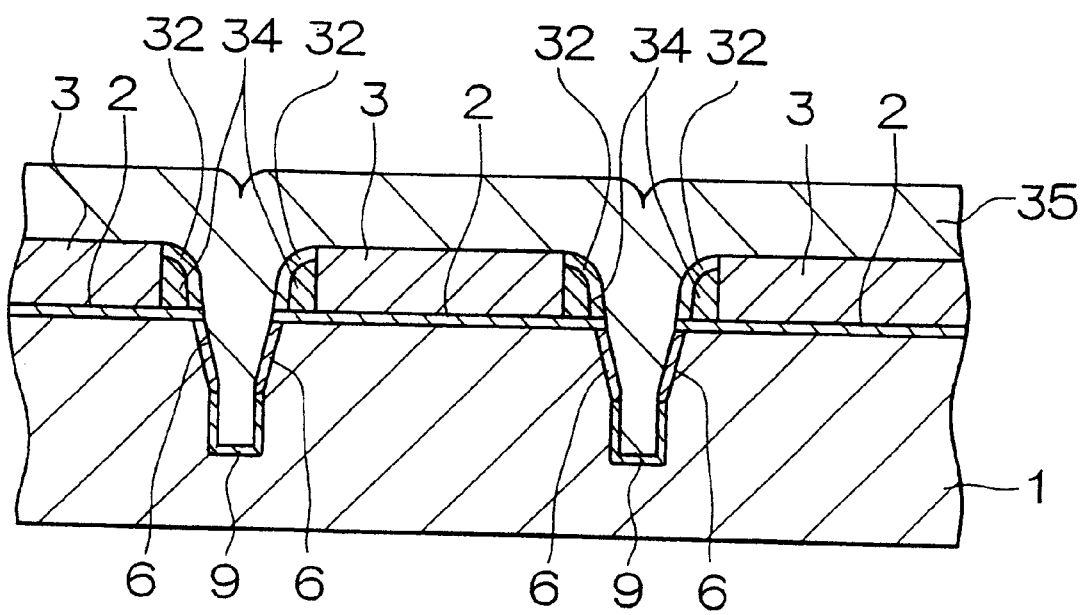

As shown in FIG. 10D, a silicon oxide film 35 about 7,000 Å thick is formed by low pressure CVD method on the entire surface including the inner surfaces of the first and second trenches 4 and 7. With this processing, the first and second trenches 4 and 7 are completely filled with the silicon oxide film 35.

Figure 11A:
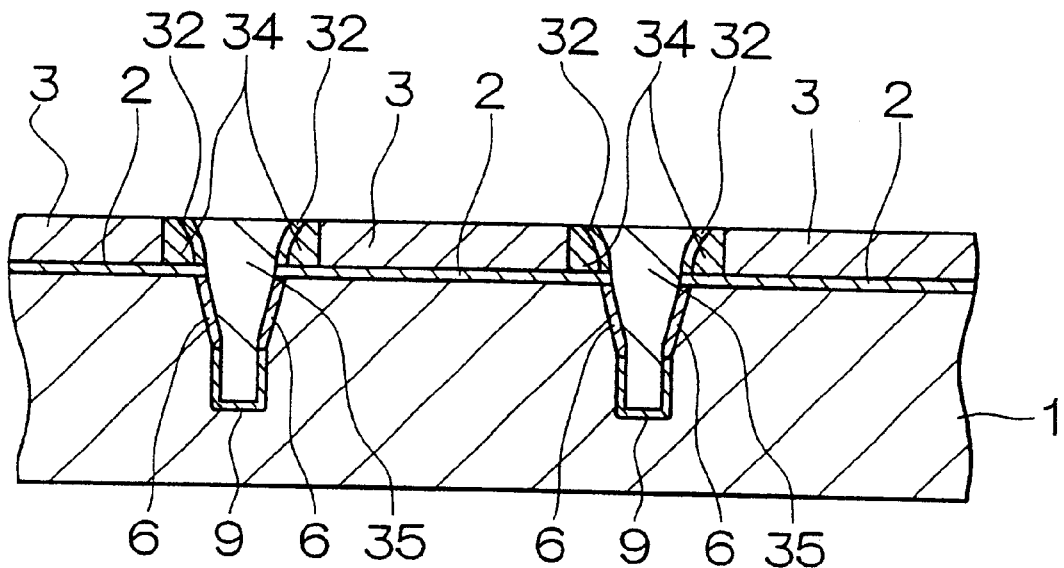
FIGS. 11A to 11C are schematic sectional views, respectively, showing the steps in manufacturing an nMOS transistor according to the second embodiment.

As shown in FIG. 11A, the silicon oxide film 35 is removed by chemical mechanical polishing (CMP) method until the silicon nitride film 3 serving as a stopper is exposed.

Figure 11B:
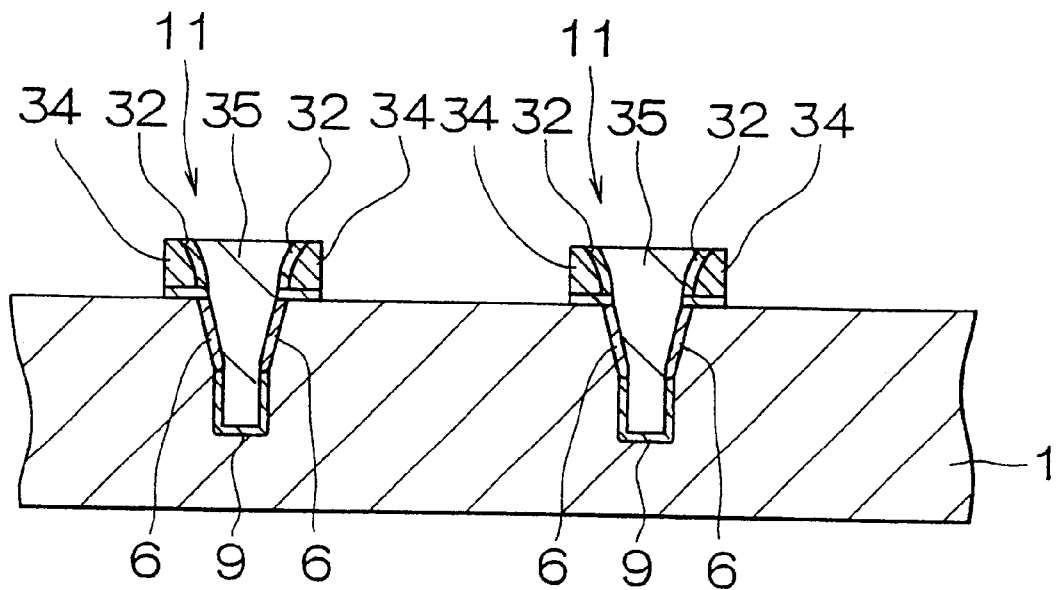

As shown in FIG. 11B, the silicon nitride film 3 is removed by anisotropic dry etching. Subsequently, the thermal oxide film 2 is removed by wet etching using hydrogen fluoride, or dry etching. As a result, the silicon oxide film 35 is left in the first and second trenches 4 and 7 to complete a trench element isolation structure 11. The trench element isolation structure 11 defines an element formation region 12.

At this time, the side walls 32 and 34 are exposed at the side edge of the silicon oxide film 35 filling the first and second trenches 4 and 7. As is apparent from FIG. 11B, the side walls 32 and 34 are formed around the first trench 4.

Figure 11C:
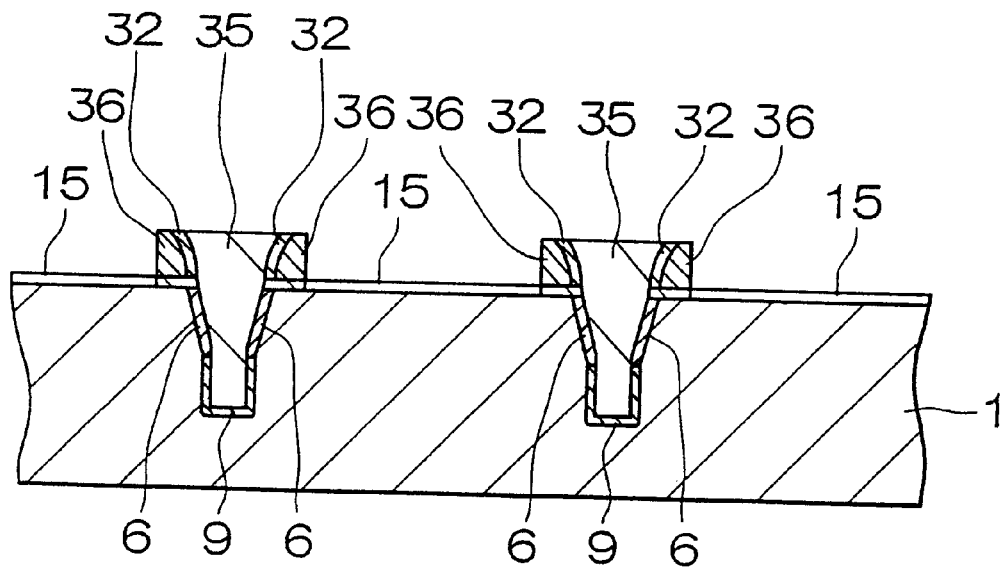

As shown in FIG. 11C, of the side walls 32 and 34, the side wall 34 made of the polysilicon film 31 is thermally oxidized by heat-treating the entire surface of the p-type silicon semiconductor substrate 1. Of the side walls 32 and 34, the outer side wall 34 serves as a thermal oxide film 36.

In this way, since the low-etching-rate thermal oxide film 36 can be formed to cover the outer peripheral surface of the silicon oxide film 35 forming the trench element isolation structure 11, the trench element isolation structure 11 becomes more resistant to etching. For this reason, the thermal oxide film 36 can reliably protect the trench element isolation structure 11 from subsequent etching or cleaning, and can prevent it from being removed.

At the same time as formation of the thermal oxide film 36, the exposed surface of the p-type silicon semiconductor substrate 1 is thermally oxidized to form a gate oxide film 15.

After a gate oxide film 16 is formed and patterned, an impurity diffusion layer 21 is formed by ion implantation in the surface regions of the p-type silicon semiconductor substrate 1 on the two sides of the gate oxide film 16.

Figure 12:
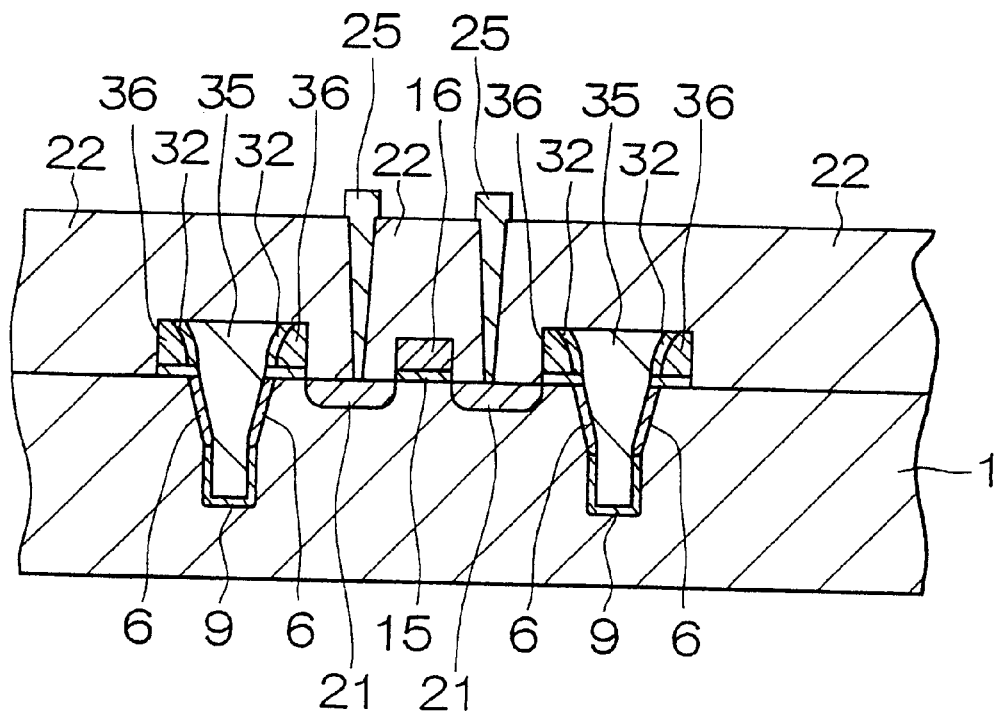
FIG. 12 is a schematic sectional view showing the nMOS transistor according to the second embodiment.

A BPSG film 22 is deposited, contact holes 23 and 24 are formed, and an aluminum wiring layer 25 is formed to complete an nMOS transistor, as shown in FIG. 12.

As described above, in the second embodiment of the present invention, the side wall 34 made of the polysilicon film 31 can be formed at the outer edge of the trench element isolation structure 11. By thermally oxidizing the side wall 34, the thermal oxide film 36 can be obtained.

With this structure, the outer edge of the trench element isolation structure 11 is covered with the low-etching-rate thermal oxide film 36. A trench element isolation structure 11 resistant to subsequent etching, cleaning, and the like can be attained.

The trench element isolation structure 11 is not removed to recess it from the surface of the p-type silicon semiconductor substrate 1. Even if a gate electrode is formed over the active region from the trench element isolation structure 11, concentration of an electric field at the element isolation end can be relaxed.

Similar to the first embodiment, the inclined surface 5 formed on the side wall of the first trench 4 can prevent concentration of an electric field near the inclined surface 5 on the p-type silicon semiconductor substrate 1, and can suppress formation of a parasitic transistor over the trench element isolation structure 11.

The threshold voltage of the nMOS transistor can be kept constant and can be prevented from varying.

The side wall 8 of the second trench 7 can be formed nearly perpendicular to the surface of the p-type silicon semiconductor substrate 1 by dry etching in an atmosphere mixture of hydrogen bromide (HBr) and oxygen. Accordingly, the second trench 7 can be made sufficiently deep, and adjacent element formation regions can be reliably electrically isolated.

An nMOS transistor exhibiting excellent electrical characteristics can be formed in the element formation region 12 defined by the trench element isolation structure 11 having the first and second trenches 4 and 7.

Consequently, a MOS transistor in which any decrease in threshold voltage is suppressed, and the leakage current is minimized can be realized.

Third Embodiment

The third embodiment of the present invention will be described in detail below with reference to the accompanying drawings. FIGS. 13A to 16C are schematic sectional views, respectively, showing the steps in manufacturing a MOS transistor according to the third embodiment.

Figure 13A:
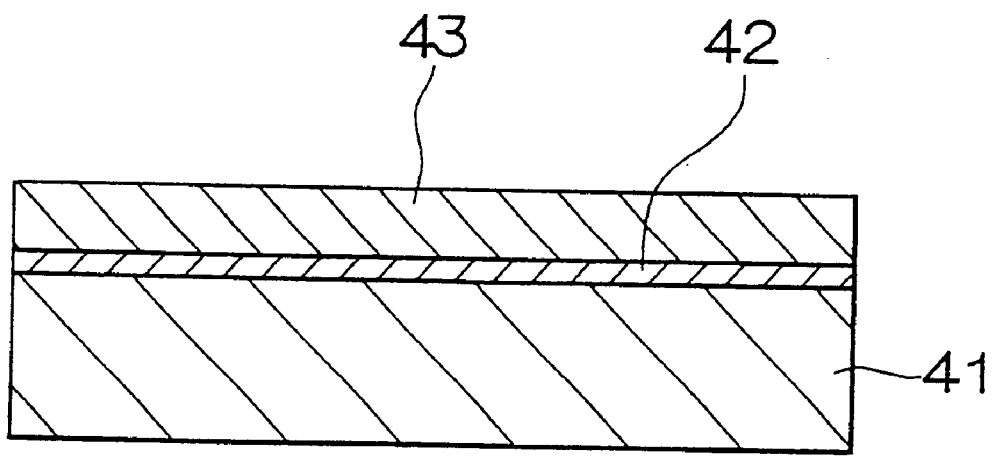
FIGS. 13A to 13D are schematic sectional views, respectively, showing the steps in manufacturing an nMOS transistor according to the third embodiment.

As shown in FIG. 13A, the surface of a p-type silicon semiconductor substrate 41 is thermally oxidized to form a thermal oxide film 42 having a thickness of about 300 Å. On the thermal oxide film 42, a silicon nitride film 43 having a thickness of about 2,000 Å is formed. The thermal oxide film 42 functions as a pad insulating film for relaxing stress generated on the p-type silicon semiconductor substrate 41 and the silicon nitride film 43.

Figure 13B:
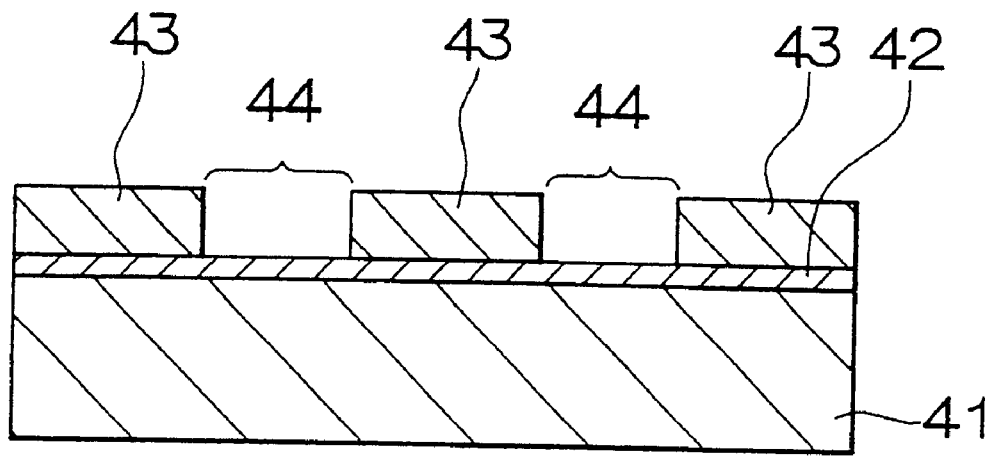

As shown in FIG. 13B, the silicon nitride film 43 is selectively removed from an element isolation region by photolithography and subsequent dry etching to form an opening 44.

Figure 13C:
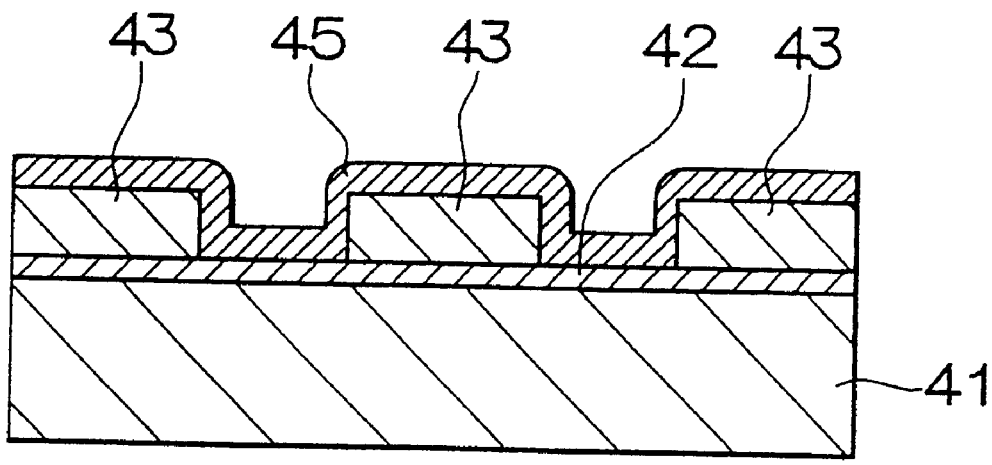

As shown in FIG. 13C, a polysilicon film 45 having a thickness of about 300 Å is formed on the entire surface of the p-type silicon semiconductor substrate 41. Accordingly, the inner wall surface of the opening 44 is covered with the polysilicon film 45.

Figure 13D:
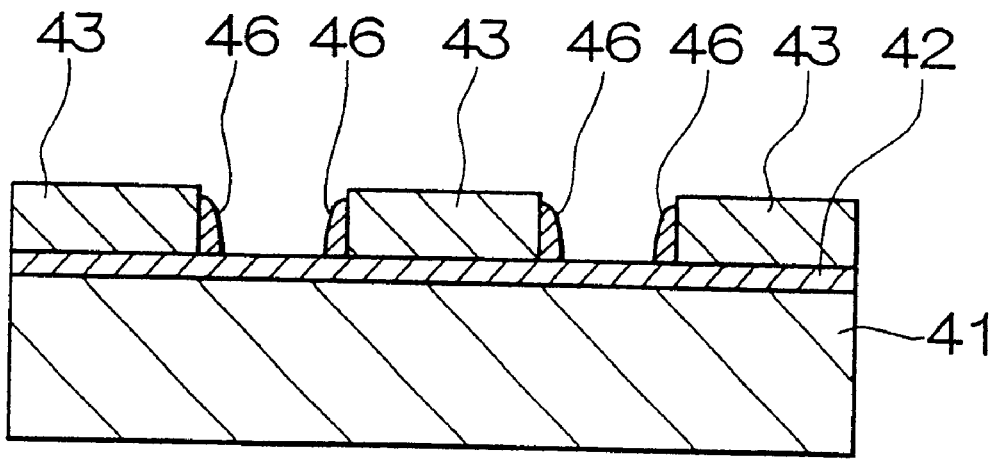

As shown in FIG. 13D, the polysilicon film 45 is removed by anisotropic etching until the thermal oxide film 42 is exposed in the opening 44. That is, anisotropic etching is performed using the thermal oxide film 42 as an etching stopper. As a result, the polysilicon film 45 remains on only the side wall of the silicon nitride film 43 in the opening 44, thereby forming a side wall 46 of the polysilicon film 45.

Figure 14A:
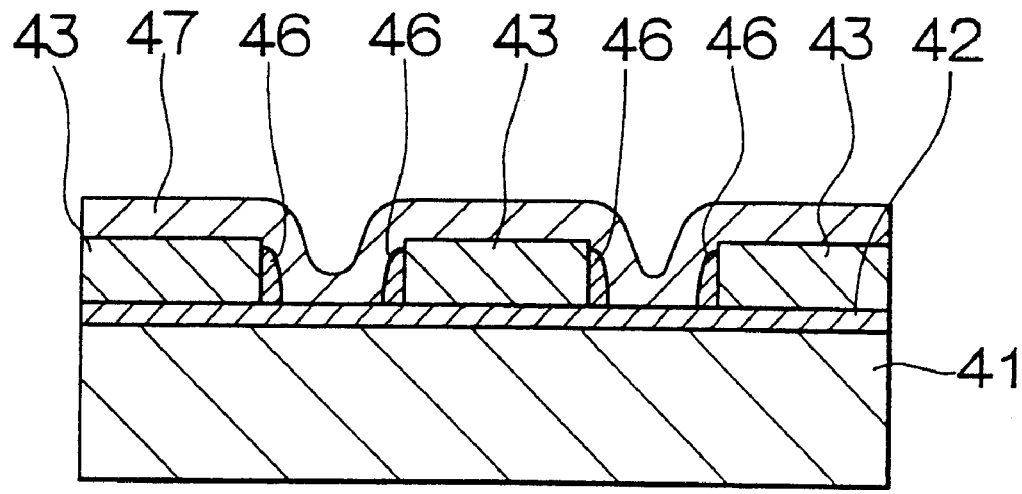
FIGS. 14A to 14D are schematic sectional views, respectively, showing the steps in manufacturing an nMOS transistor according to the third embodiment.

As shown in FIG. 14A, a silicon oxide film 47 is formed by CVD method on the entire surface of the p-type silicon semiconductor substrate 41.

Figure 14B:
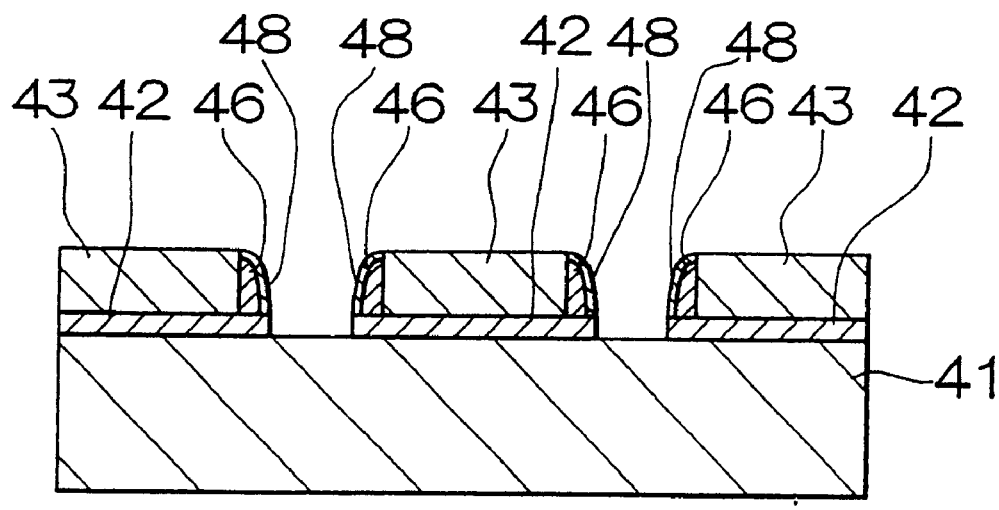

As shown in FIG. 14B, the silicon oxide film 47 is removed by anisotropic etching until the p-type silicon semiconductor substrate 41 is exposed in the opening 44. That is, anisotropic etching is performed using the p-type silicon semiconductor substrate 41 as an etching stopper. Then, the silicon oxide film 47 is left and covers the side wall 46, forming a side wall 48 of the silicon oxide film 47.

Figure 14C:
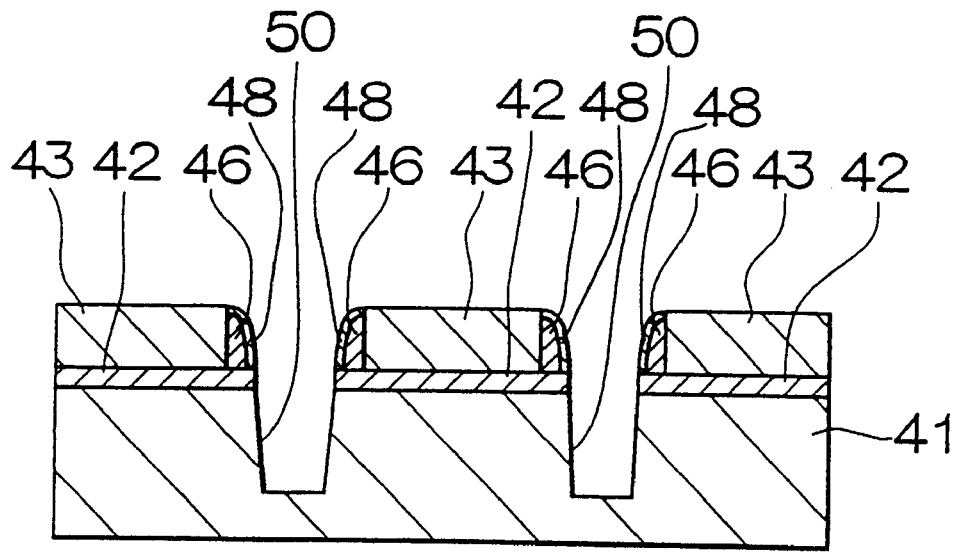

As shown in FIG. 14C, a trench 50 having a depth of about 4,000 Å is formed perpendicular to the surface of the p-type silicon semiconductor substrate 41 by etching using the side walls 46 and 48 and the silicon nitride film 43 as a mask.

Since the side wall 46 made of the polysilicon film 45 is covered with the side wall 48 formed of the silicon oxide film 47, no side wall 46 is removed even upon removing the p-type silicon semiconductor substrate 41.

Figure 14D:
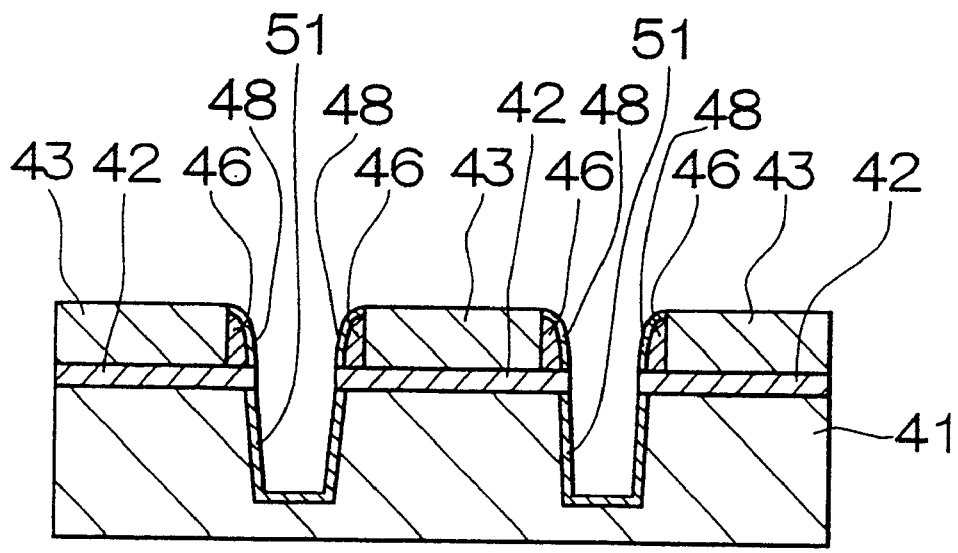

As shown in FIG. 14D, a thermal oxide film 51 about 200 Å thick is formed by thermally oxidizing the inner wall surface of the trench in order to cover a damaged layer formed on the inner wall surface of the formed trench 50.

Figure 15A:
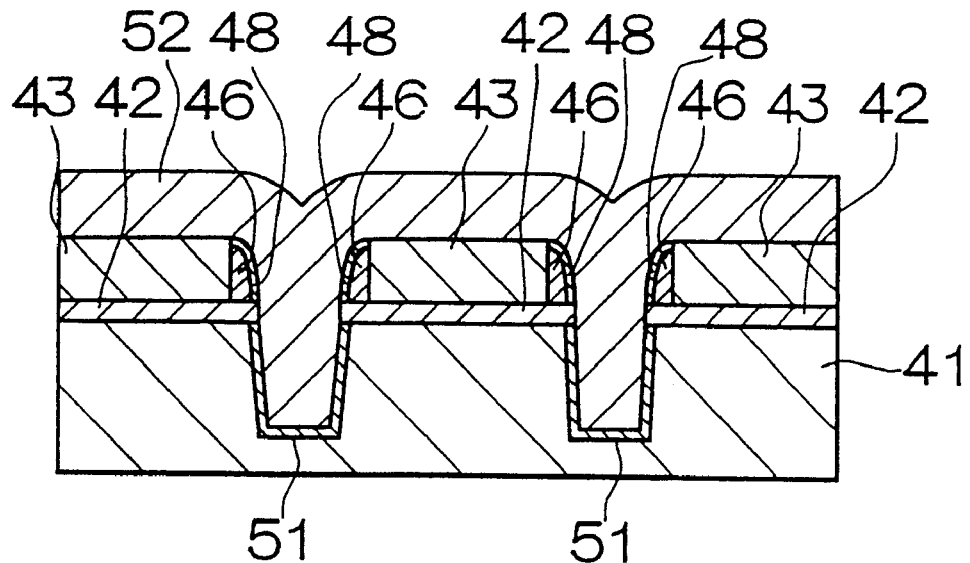
FIGS. 15A to 15D are schematic sectional views, respectively, showing the steps in manufacturing an nMOS transistor according to the third embodiment.

As shown in FIG. 15A, a silicon oxide film 52 having a thickness of about 8,000 Å is formed by CVD method to completely fill the trench 50.

Figure 15B:
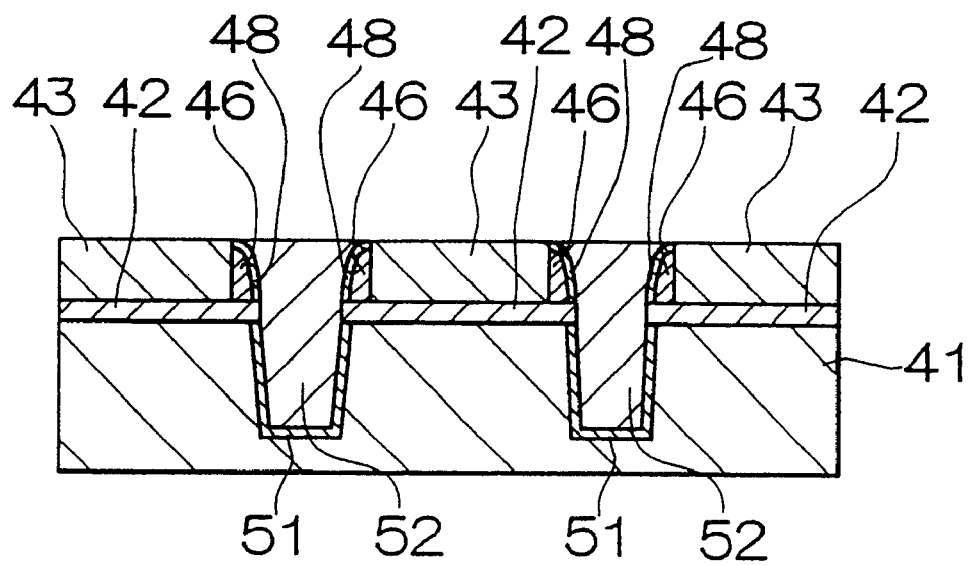

As shown in FIG. 15B, the silicon oxide film 52 is removed by chemical mechanical polishing (CMP) method until the silicon nitride film 43 is exposed. At this time, the silicon nitride film 43 functions as a polishing stopper, and the silicon oxide film 52 remains in the trench 50.

Figure 15C:
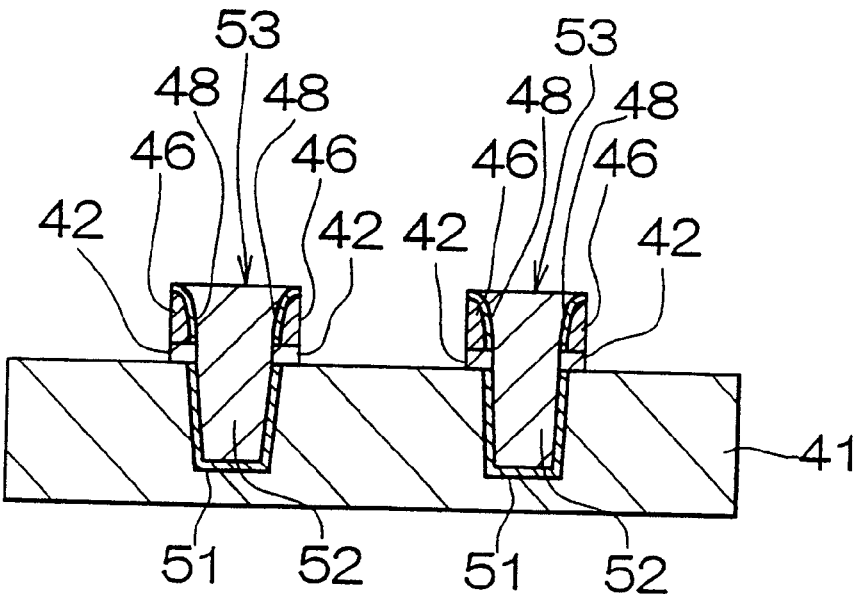

As shown in FIG. 15C, the silicon nitride film 43 used as a formation mask for the trench 50 is removed by wet etching with hot phosphoric acid. After that, the thermal oxide film 42 is removed with hydrofluoric acid or the like to expose the surface of the p-type silicon semiconductor substrate 41, thereby forming a trench element isolation structure 53 of the silicon oxide film 52. At this time, the side walls 46 and 48 are exposed at the side edge of the silicon oxide film 52 filling the trench 50. As is apparent from FIG. 15C, the side walls 46 and 48 are formed around the trench 50.

Figure 15D:
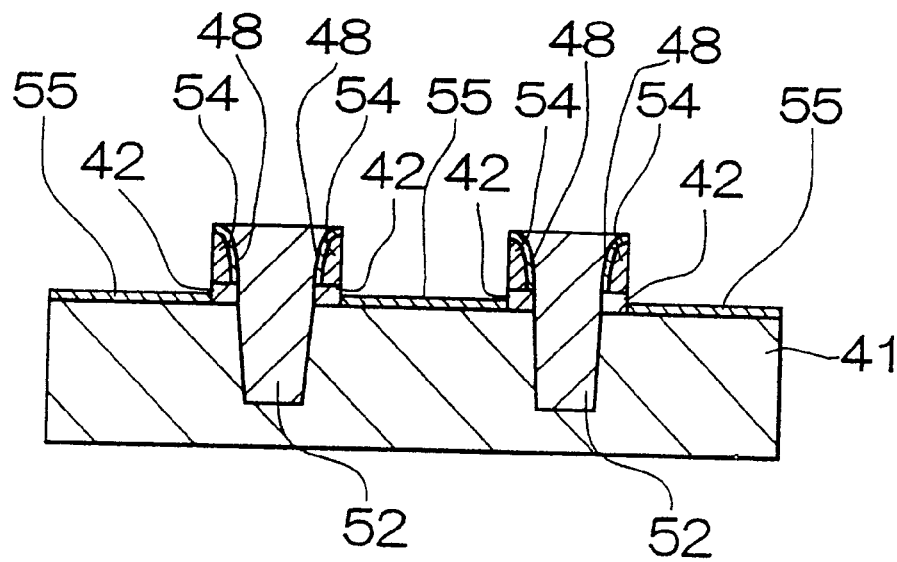

As shown in FIG. 15D, of the side walls 46 and 48, the side wall 46 made of the polysilicon film 45 is thermally oxidized by heat-treating the entire surface of the p-type silicon semiconductor substrate 41. Of the side walls 46 and 48, the outer side wall 46 serves as a thermal oxide film 54.

As described above, since the low-etching-rate thermal oxide film 54 can be formed to cover the outer peripheral surface of the silicon oxide film 52 forming the trench element isolation structure 53, the trench element isolation structure 53 becomes more resistant to etching. Therefore, the thermal oxide film 54 can reliably protect the trench element isolation structure 53 from subsequent etching or cleaning, and can prevent it from being removed.

At the same time as formation of the thermal oxide film 54, the exposed surface of the p-type silicon semiconductor substrate 41 is thermally oxidized to form a gate oxide film 55.

Figure 16A:
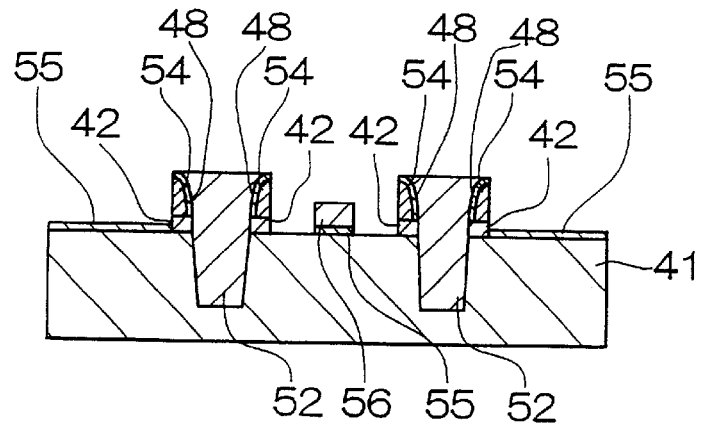
FIGS. 16A to 16C are schematic sectional views, respectively, showing the steps in manufacturing an nMOS transistor according to the third embodiment.

As shown in FIG. 16A, a doped polysilicon film 56 is formed on the entire surface. The polysilicon film 56 and the thermal oxide film 55 are patterned into a gate electrode shape by photolithography and subsequent dry etching.

Figure 16B:
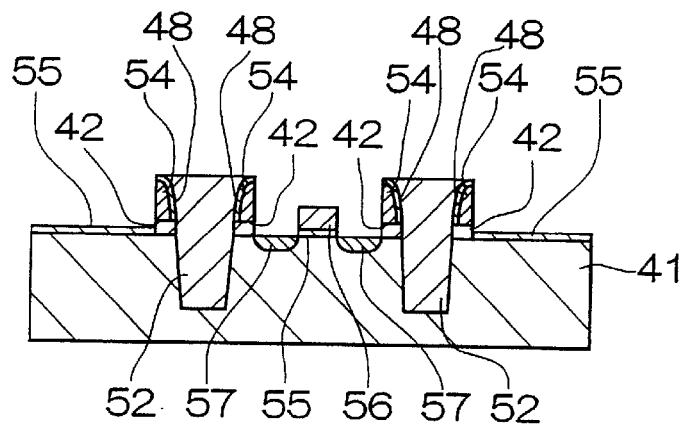

As shown in FIG. 16B, arsenic is ion-implanted using, as a mask, the trench element isolation structure 53 and the polysilicon film 56 serving as a gate electrode. By annealing, a pair of impurity diffusion layers 57 serving as a source and drain are formed in the surface regions of the p-type silicon semiconductor substrate 41 on the two sides of the polysilicon film 56 serving as a gate electrode.

Figure 16C:
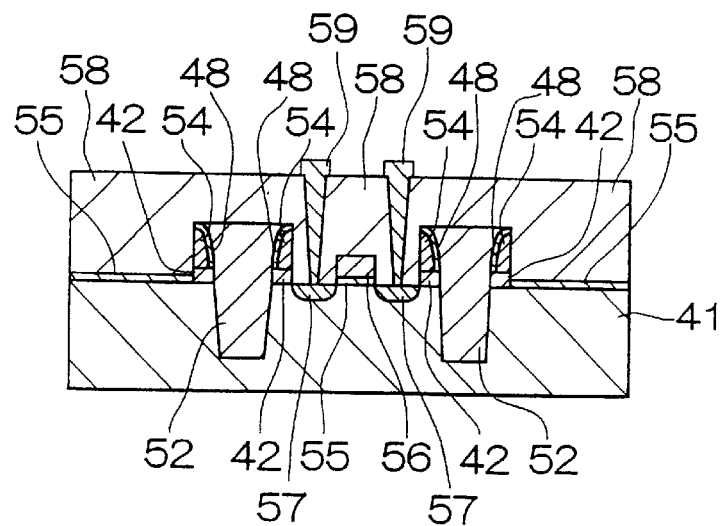

After a BPSG film 58 is formed as an interlevel insulating film on the entire surface and planarized by reflow, a contact hole is formed in the BPSG film 58 to reach the impurity diffusion layer 57. Then, an aluminum film 59 is sputtered to fill the contact hole reaching the impurity diffusion layer 57, and patterned to complete an nMOS transistor, as shown in FIG. 16C.

As described above, in the third embodiment of the present invention, the side wall 46 made of the polysilicon film 45 can be formed at the outer edge of the trench element isolation structure 53. By thermally oxidizing the side wall 46, the thermal oxide film 54 can be obtained.

With this structure, the outer edge of the trench element isolation structure 53 is covered with the low-etching-rate thermal oxide film 54. The trench element isolation structure 53 resistant to subsequent etching, cleaning, and the like can be realized.

The trench element isolation structure 53 is not removed to recess it from the surface of the p-type silicon semiconductor substrate 41. Even if a gate electrode is formed over the active region from the trench element isolation structure 53, concentration of an electric field at the element isolation end can be relaxed.

As a result, a MOS transistor in which any decrease in threshold voltage is suppressed, and the leakage current is minimized can be attained.

Fourth Embodiment

The fourth embodiment of the present invention will be described in detail below with reference to the accompanying drawings. FIGS. 17A to 20 are schematic sectional views, respectively, showing the steps in manufacturing a MOS transistor according to the fourth embodiment.

Figure 17A:
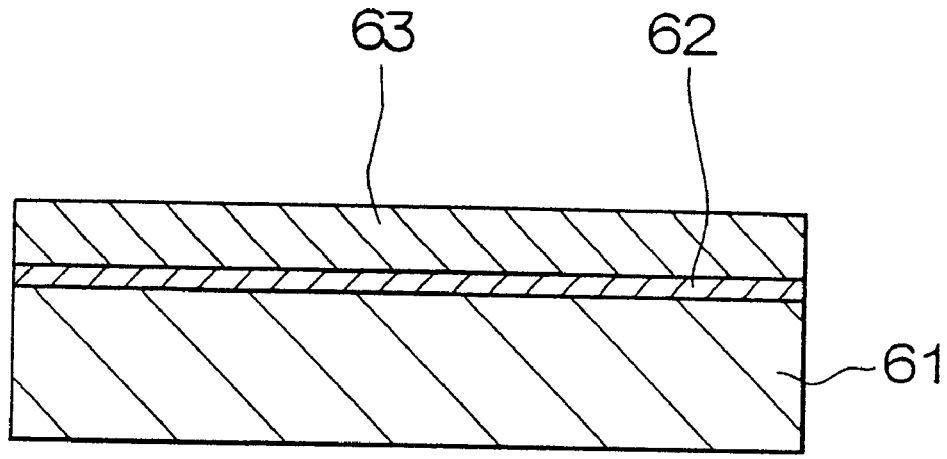
FIGS. 17A to 17D are schematic sectional views, respectively, showing the steps in manufacturing an nMOS transistor according to the fourth embodiment.

As shown in FIG. 17A, the surface of a p-type silicon semiconductor substrate 61 is thermally oxidized to form a thermal oxide film 62 having a thickness of about 300 Å. On the thermal oxide film 62, a silicon nitride film 63 about 2,000 Å thick is formed. The thermal oxide film 62 functions as a pad insulating film for relaxing stress generated on the p-type silicon semiconductor substrate 61 and the silicon nitride film 63.

Figure 17B:
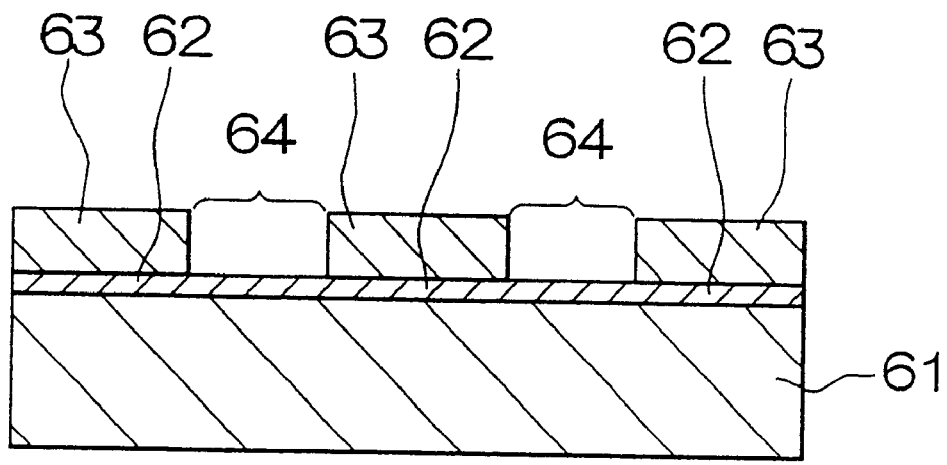

As shown in FIG. 17B, the silicon nitride film 63 and the thermal oxide film 62 are selectively removed from an element isolation region by photolithography and subsequent dry etching to form an opening 64 through which the p-type silicon semiconductor substrate 61 is exposed.

Figure 17C:
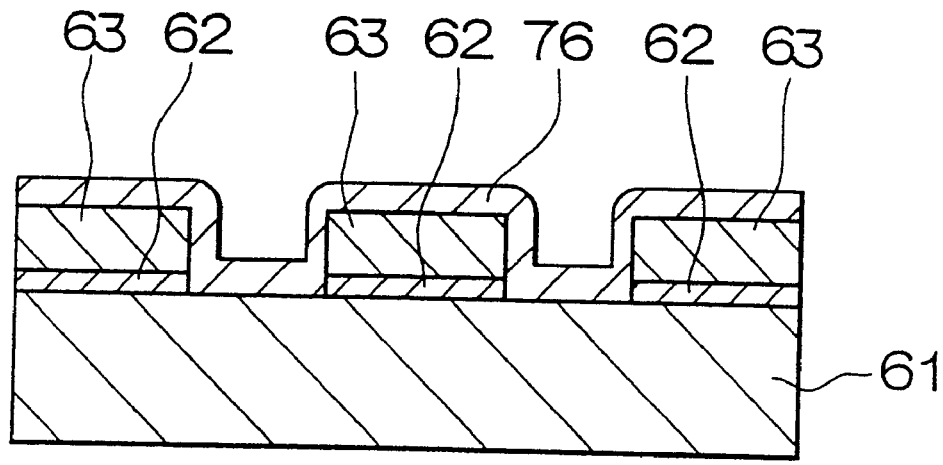
Figure 17D:
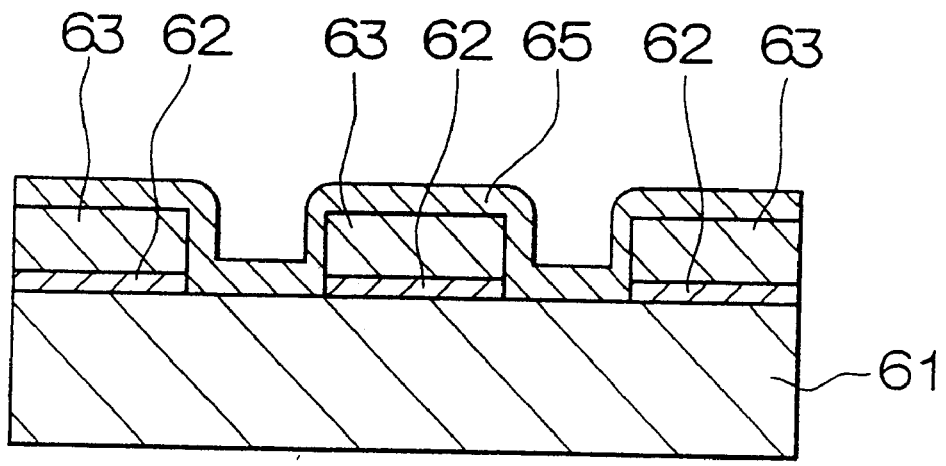

As shown in FIG. 17C, a polysilicon film 76 having a thickness around 500 Å is formed on the entire surface of the p-type silicon semiconductor substrate 61. The entire surface of the p-type silicon semiconductor substrate 61 is heat-treated to thermally oxidize the polysilicon film 76, thereby forming a thermal oxide film 65 having a thickness of about 750 Å. FIG. 17D shows this state.

Figure 18A:
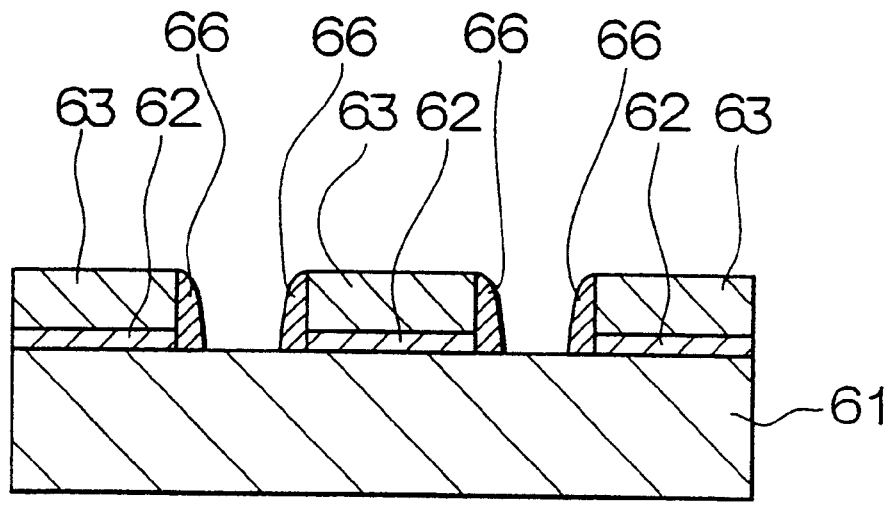
FIGS. 18A to 18D are schematic sectional views, respectively, showing the steps in manufacturing an nMOS transistor according to the fourth embodiment.

As shown in FIG. 18A, the thermal oxide film 65 is removed by anisotropic etching until the p-type silicon semiconductor substrate 61 is exposed in the opening 64. That is, anisotropic etching is performed using the p-type silicon semiconductor substrate 61 as an etching stopper. Consequently, the thermal oxide film 65 is left at only the side walls of the silicon nitride film 63 and the thermal oxide film 62 in the opening 64, thereby forming a side wall 66 of the thermal oxide film 65.

Figure 18B:
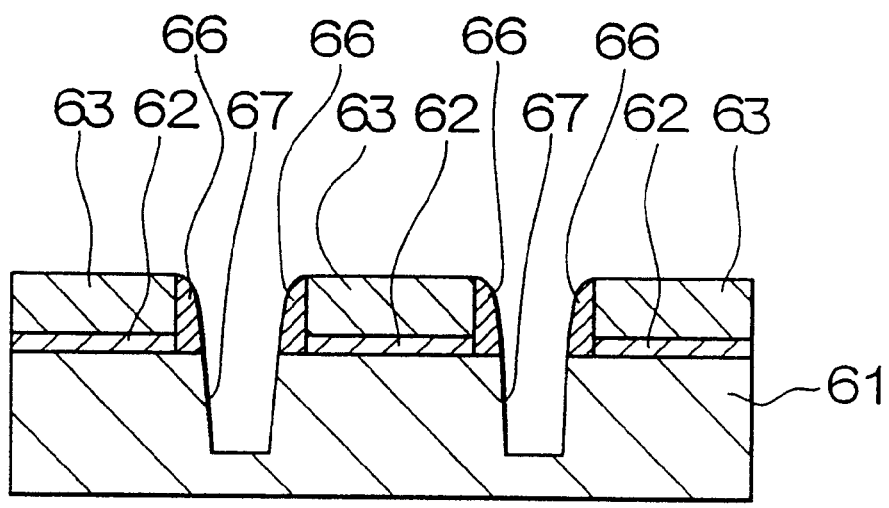
Figure 18:
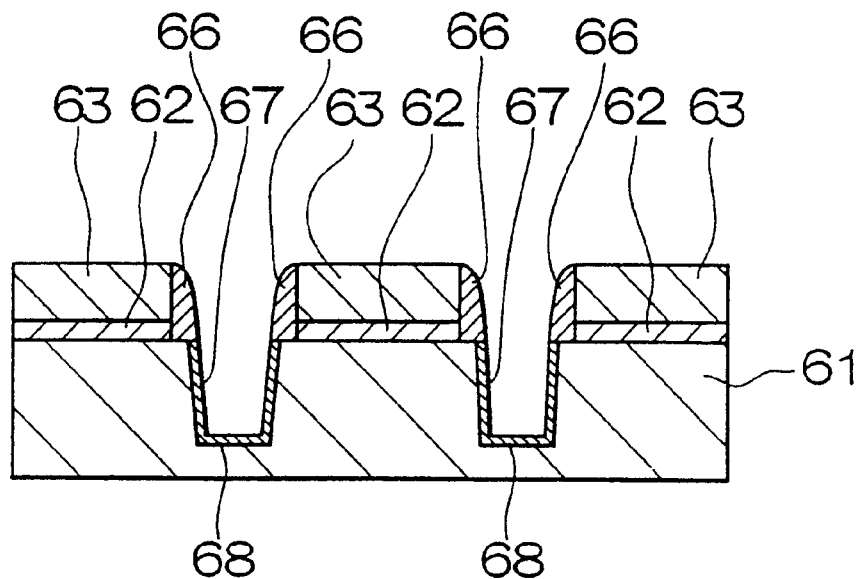
Figure 18:
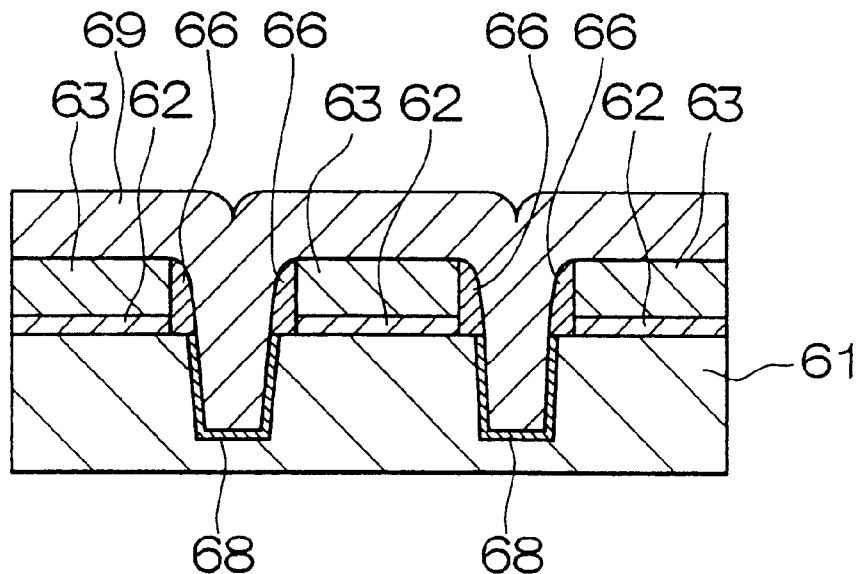

As shown in FIG. 18B, a trench 67 about 4,000 Å deep is formed perpendicular to the surface of the p-type silicon semiconductor substrate 61 by etching using the side wall 66 and the silicon nitride film 63 as a mask.

As shown in FIG. 18C, a thermal oxide film 68 having a thickness of about 200 Å is formed by thermally oxidizing the inner wall surface of the trench in order to cover a damaged layer formed on the inner wall surface of the formed trench 67.

As shown in FIG. 18D, a silicon oxide film 69 having a thickness of about 8,000 Å is formed by CVD method to completely fill the trench 67.

Figure 19A:
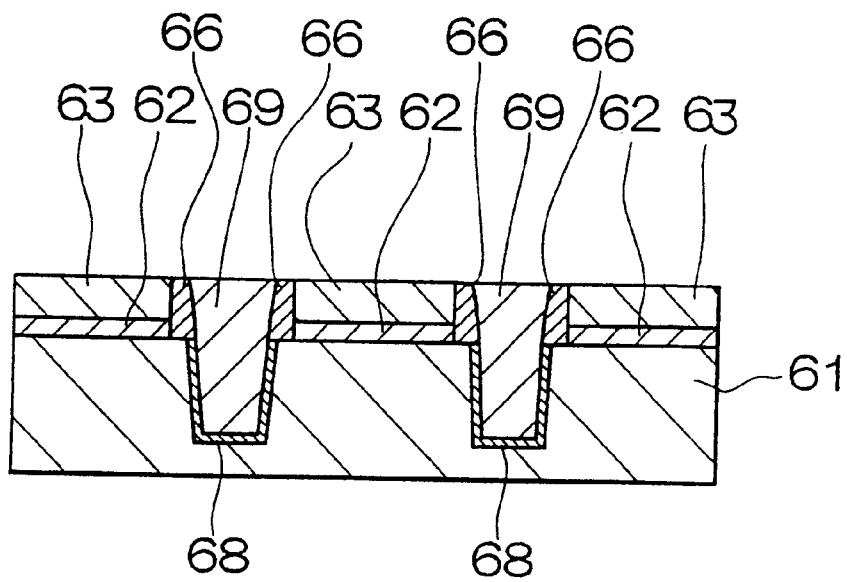
FIGS. 19A to 19D are schematic sectional views, respectively, showing the steps in manufacturing an nMOS transistor according to the fourth embodiment.

As shown in FIG. 19A, the silicon oxide film 69 is removed by chemical mechanical polishing (CMP) method until the silicon nitride film 63 is exposed. At this time, the silicon nitride film 63 functions as a polishing stopper, and the silicon oxide film 69 remains in the trench 67.

Figure 19B:
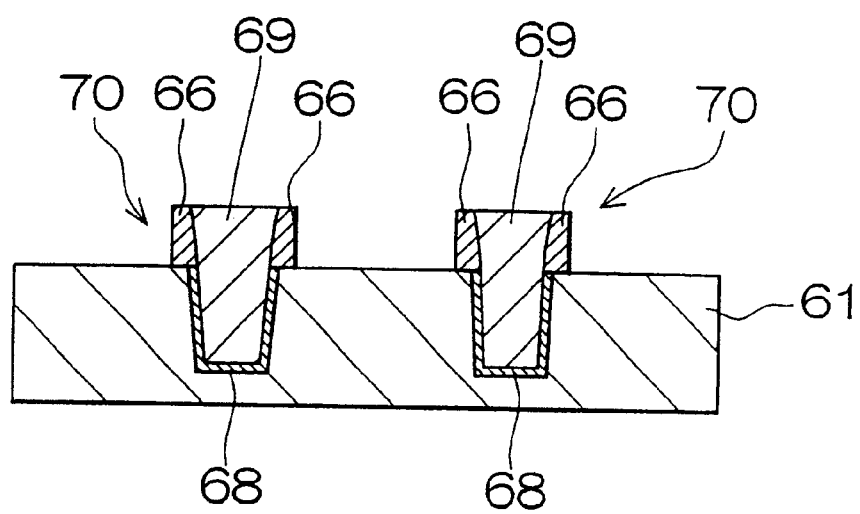

As shown in FIG. 19B, the silicon nitride film 63 used as a formation mask for the trench 67 is removed by wet etching with hot phosphoric acid. Then, the thermal oxide film 62 is removed with hydrofluoric acid or the like to expose the surface of the p-type silicon semiconductor substrate 61, thereby forming a trench element isolation structure 70 of the silicon oxide film 69. At this time, the side wall 66 is exposed at the side edge of the silicon oxide film 69 filling the trench 67. As is apparent from FIG. 19B, the side wall 66 is formed around the trench 67.

Since the side wall 66 made of the low-etching-rate thermal oxide film 65 can be formed to cover the outer peripheral surface of the silicon oxide film 69 forming the trench element isolation structure 70, the trench element isolation structure 70 becomes more resistant to etching. Therefore, the thermal oxide film 65 can reliably protect the trench element isolation structure 70 from subsequent etching or cleaning, and can prevent it from being removed.

Figure 19C:
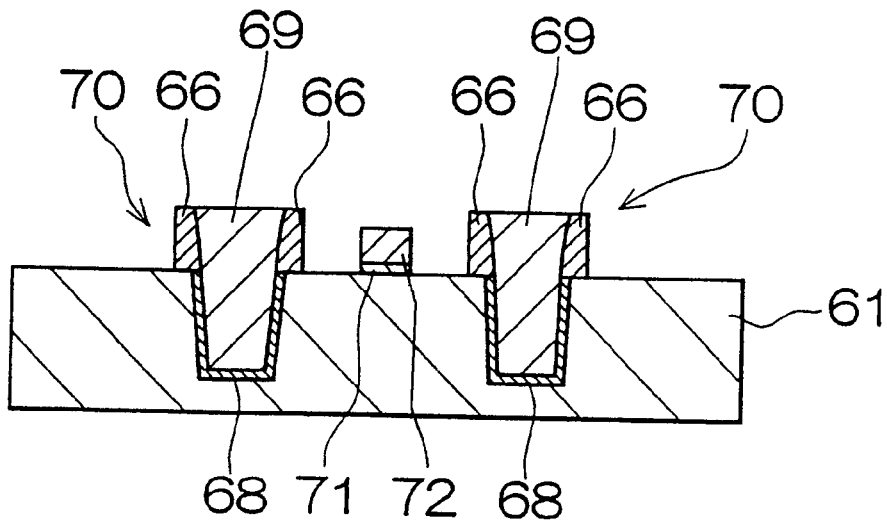

As shown in FIG. 19C, after the exposed surface of the p-type silicon semiconductor substrate 61 is thermally oxidized to form a gate oxide film 71, a doped polysilicon film 72 is formed on the entire surface. The polysilicon film 72 and the gate oxide film 71 are patterned into a gate electrode shape by photolithography and subsequent dry etching.

Figure 19D:
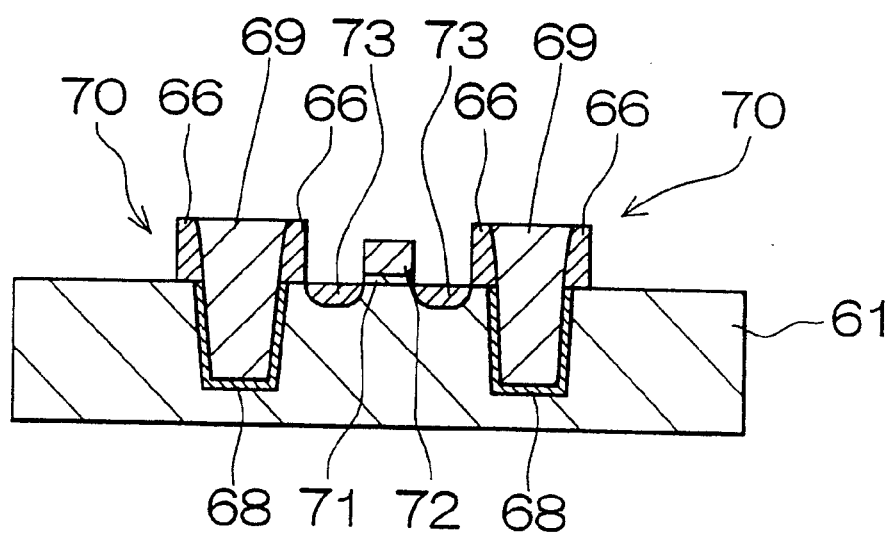

As shown in FIG. 19D, arsenic is ion-implanted using, as a mask, the trench element isolation structure 70 and the polysilicon film 72 serving as a gate electrode. By annealing, a pair of impurity diffusion layers 73 serving as a source and drain are formed in the surface regions of the p-type silicon semiconductor substrate 61 on the two sides of the polysilicon film 72 serving as a gate electrode.

Figure 20:
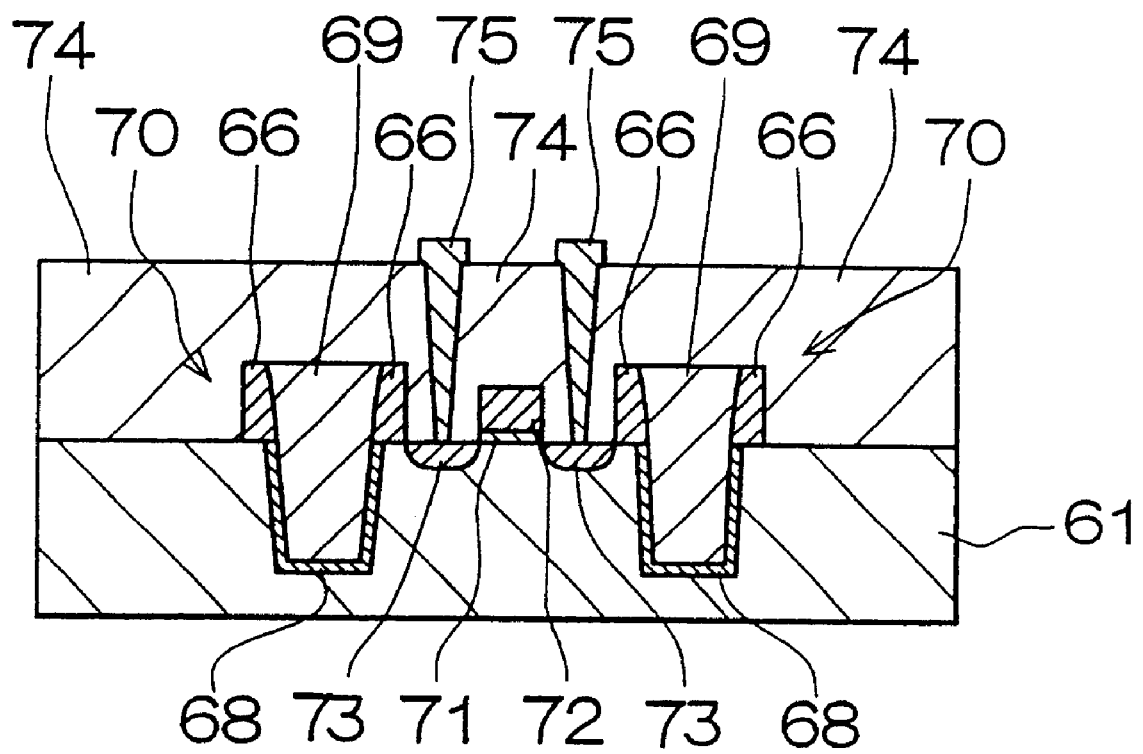
FIG. 20 is a schematic sectional view showing the nMOS transistor according to the fourth embodiment.

After a BPSG film 74 is formed as an interlevel insulating film on the entire surface and planarized by reflow, a contact hole is formed to reach the impurity diffusion layer 73. Then, an aluminum film 75 is sputtered to fill the contact hole reaching the impurity diffusion layer 73, and patterned to complete an nMOS transistor, as shown in FIG. 20.

As discussed above, in the fourth embodiment of the present invention, the side wall 66 made of the thermal oxide film 65 can be formed at the outer edge of the trench element isolation structure 70.

With this structure, the outer edge of the trench element isolation structure 70 is covered with the low-etching-rate thermal oxide film 65. The trench element isolation structure 70 resistant to subsequent etching, cleaning, and the like can be obtained.

The trench element isolation structure 70 is not removed to recess it from the surface of the p-type silicon semiconductor substrate 61. Even if a gate electrode is formed over the active region from the trench element isolation structure 70, concentration of an electric field at the element isolation end can be relaxed.

As a result, a MOS transistor in which any decrease in threshold voltage is suppressed, and the leakage current is minimized can be obtained.

Fifth Embodiment

The fifth embodiment of the present invention will be described in detail below with reference to the accompanying drawings. FIGS. 21A to 24 are schematic sectional views, respectively, showing the steps in manufacturing a MOS transistor according to the fifth embodiment. The same reference numerals as in the fourth embodiment denote the same parts.

Figure 21A:
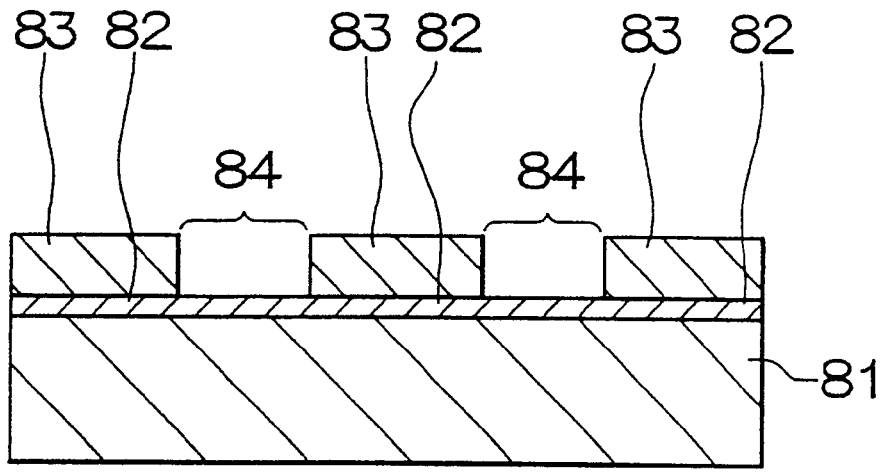
FIGS. 21A to 21D are schematic sectional views, respectively, showing the steps in manufacturing an nMOS transistor according to the fifth embodiment.

As shown in FIG. 21A, the surface of a p-type silicon semiconductor substrate 81 is thermally oxidized to form a thermal oxide film 82 having a thickness of about 300 Å. On the thermal oxide film 82, a silicon nitride film 83 having a thickness of about 2,000 Å is formed. The thermal oxide film 82 functions as a pad insulating film for relaxing stress generated on the p-type silicon semiconductor substrate 81 and the silicon nitride film 83.

The silicon nitride film 83 and the thermal oxide film 82 are selectively removed from an element isolation region by photolithography and subsequent dry etching to form an opening 84 through which the p-type silicon semiconductor substrate 81 is exposed.

Figure 21B:
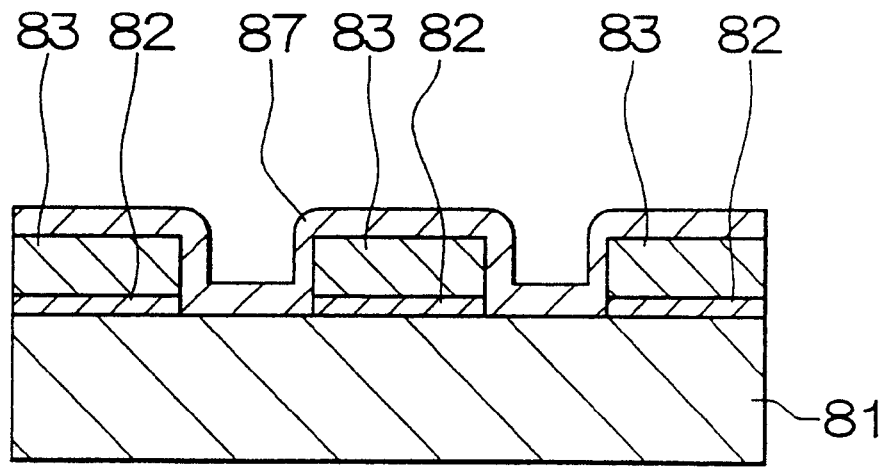
Figure 21C:
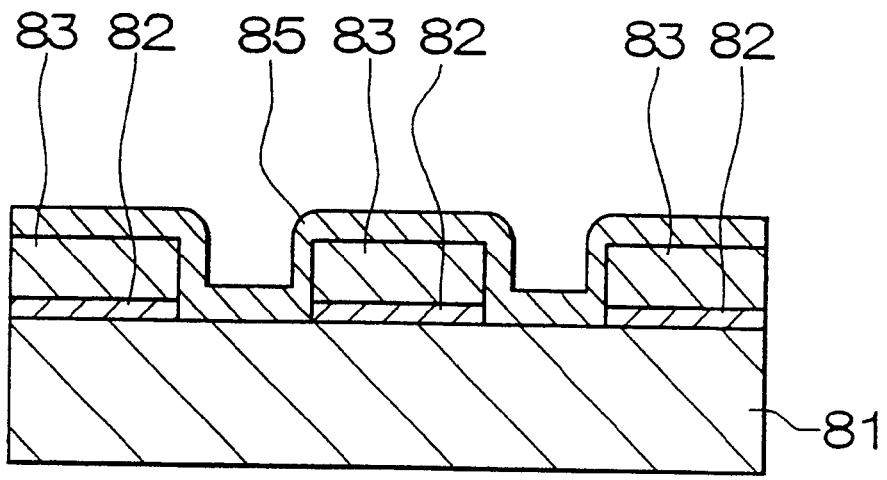

As shown in FIG. 21B, a polysilicon film 87 having a thickness of about 500 Å is formed on the entire surface of the p-type silicon semiconductor substrate 81. The entire surface of the p-type silicon semiconductor substrate 81 is heat-treated to thermally oxidize the polysilicon film 87, thereby forming a thermal oxide film 85 having a thickness of about 750 Å. FIG. 21C shows this state.

Figure 21D:
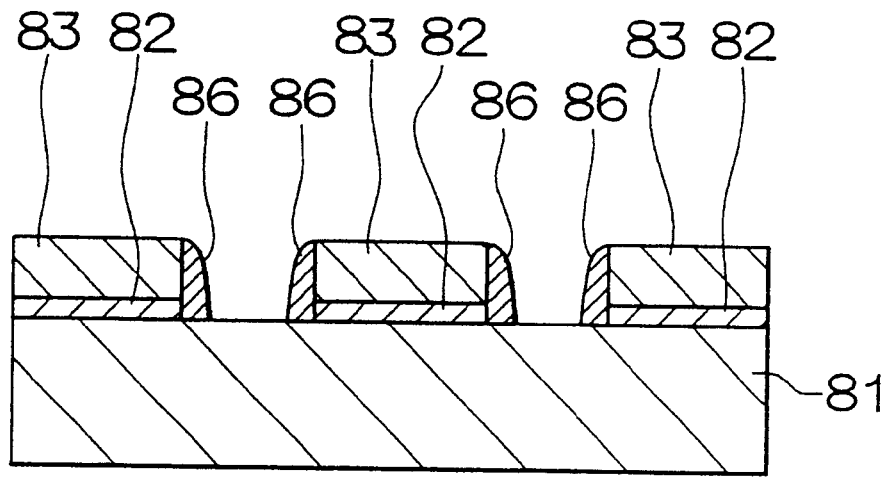

As shown in FIG. 21D, the thermal oxide film 85 is removed by anisotropic etching until the p-type silicon semiconductor substrate 81 is exposed in the opening 84. That is, anisotropic etching is performed using the p-type silicon semiconductor substrate 81 as an etching stopper. Then, the thermal oxide film 85 is left at only the side walls of the silicon nitride film 83 and the thermal oxide film 82 in the opening 84, thereby forming a side wall 86 of the thermal oxide film 85.

Figure 22A:
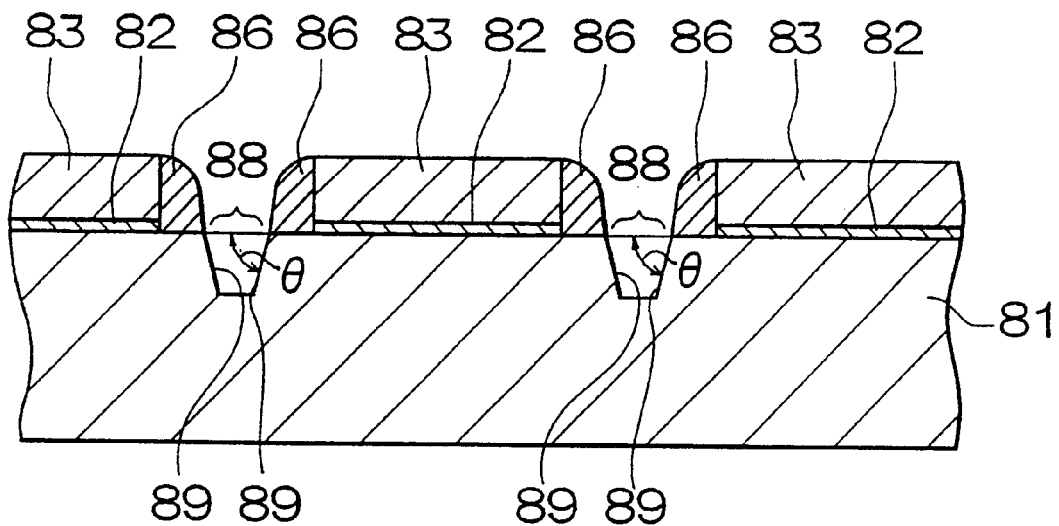
FIGS. 22A to 22D are schematic sectional views, respectively, showing the steps in manufacturing an nMOS transistor according to the fifth embodiment.

As shown in FIG. 22A, dry etching is performed in a chlorine ($Cl_2$) atmosphere using the silicon nitride film 83 and the side wall 86 as a mask to remove the p-type silicon semiconductor substrate 81 from the opening 84 and to form a first trench 88 having a depth of about 2,000 Å.

In forming the first trench 88, dry etching may be performed in an atmosphere mixture of hydrogen bromide (HBr) and chlorine instead of a chlorine atmosphere.

By dry etching under these conditions, a uniformly inclined surface 89 making an angle (θ) around 70° with the surface of the p-type silicon semiconductor substrate 81 can be formed as the side wall of the first trench 88, as shown in FIG. 22A.

By forming the inclined surface 89 in the first trench 88 and isolating elements, even an electric field generated near the inclined surface 89 on the p-type silicon semiconductor substrate 81 can be dispersed stepwise in the direction of depth along the inclined surface.

Also, since an inclined surface 89 having a predetermined angle can be formed by the above dry etching at high precision, concentration of an electric field can be effectively relaxed. An angle (θ) of the inclined surface 89 smaller than 60° requires an unnecessarily large trench width while an angle larger than 70° enhances concentration of an electric field. Therefore, by setting the angle (θ) of the inclined surface 89 within the range of 60° to 70°, an optimal structure wherein elements are micropatterned and concentration of an electric field is relaxed can be obtained.

Figure 22B:
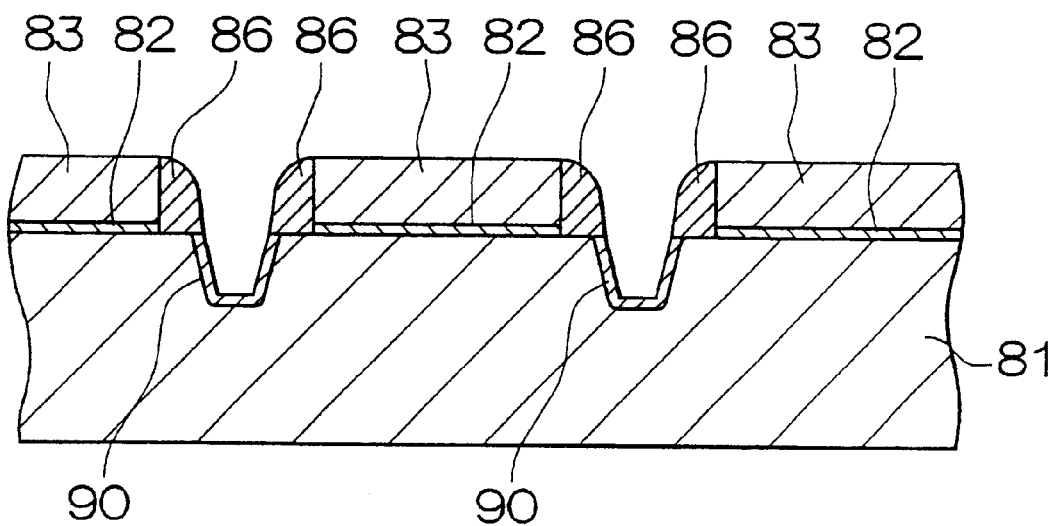

As shown in FIG. 22B, a thermal oxide film 90 about 500 Å thick is formed by thermally oxidizing in the surface region of the p-type silicon semiconductor substrate 81 exposed on the inner wall surface of the first trench 88.

Figure 22C:
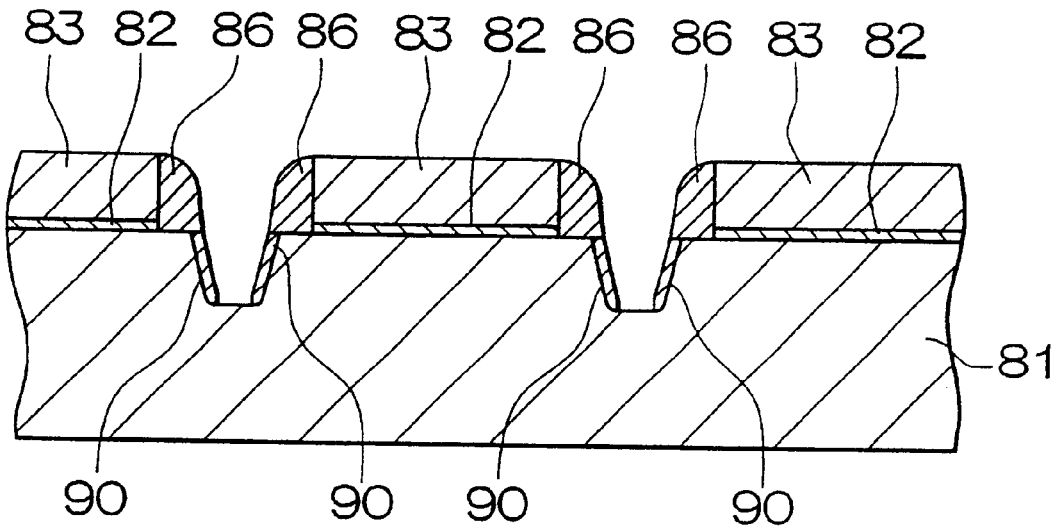

As shown in FIG. 22C, the thermal oxide film 90 is removed from only the bottom surface of the first trench 88. In this case, only the thermal oxide film 90 formed on the bottom surface of the first trench 88 can be removed by anisotropic etching. The thermal oxide film 90 is therefore left on the inclined surface 89 serving as the side wall of the first trench 88, and covers the surface of the p-type silicon semiconductor substrate 81.

Figure 22D:
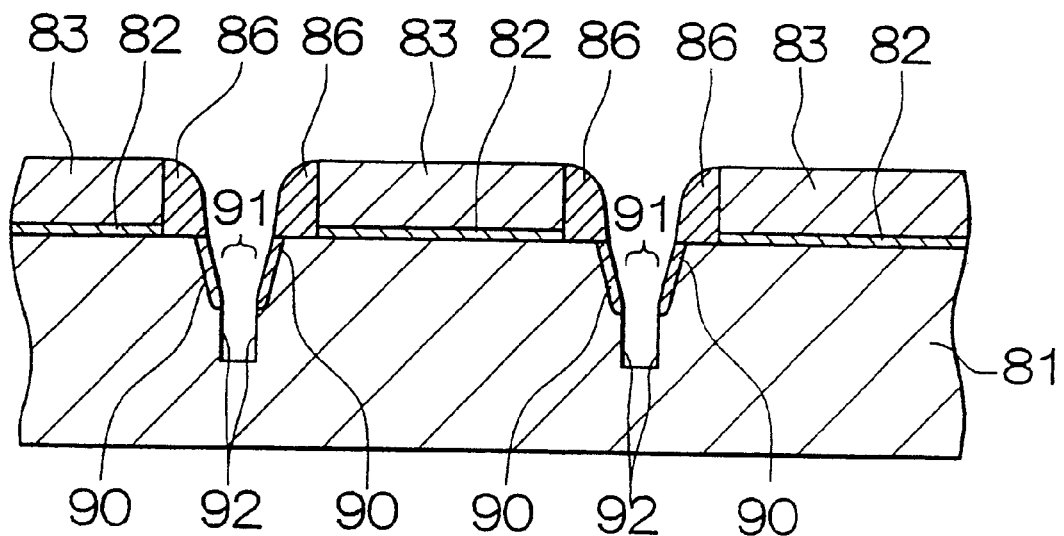

As shown in FIG. 22D, a second trench 91 extending from the first trench 88 in the direction of depth is formed by dry etching in an atmosphere mixture of hydrogen bromide (HBr) and oxygen ($O_2$) using the silicon nitride film 83 and the thermal oxide film 90 left on the inclined surface 89 as a mask.

In this dry etching, an appropriate gas flow rate of hydrogen bromide and oxygen is HBr:$O_2$=20:1 to 200:1.

By dry etching under these conditions, a side wall 92 of the second trench 91 is formed at an angle of about 80° to 90° with respect to the surface of the p-type silicon semiconductor substrate 81.

Since the side wall 92 is formed nearly perpendicular to the surface of the p-type silicon semiconductor substrate 81, the trench width of the second trench 91 is kept constant independently of the depth. As a consequence, elements can be reliably isolated by deepening the second trench 91.

In this case, the second trench 91 preferably has a depth of about 2,000 Å. The total depth of the trench including the depth of the first trench 88 is about 4,000 Å from the surface of the p-type silicon semiconductor substrate 81.

Figure 23A:
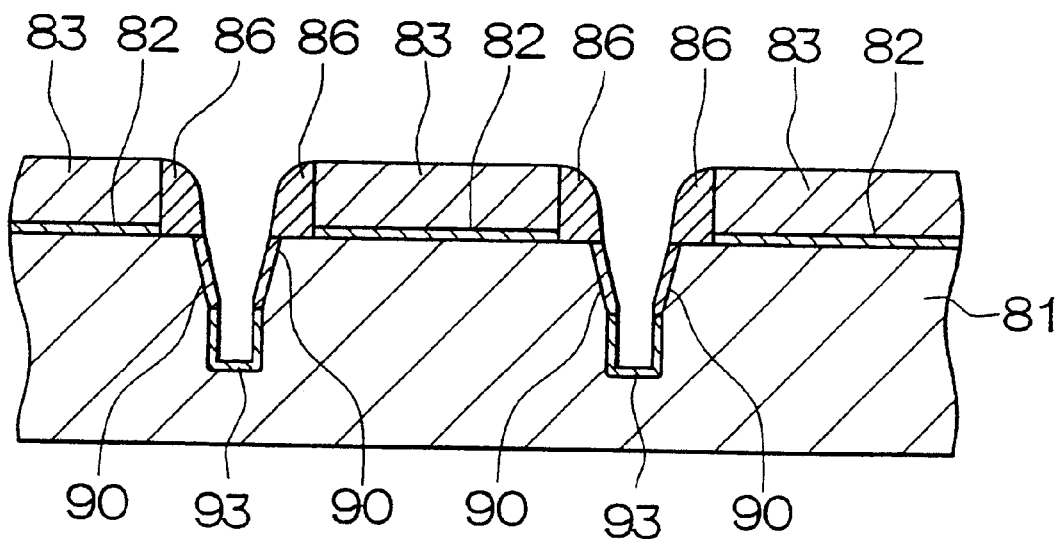
FIGS. 23A to 23D are schematic sectional views, respectively, showing the steps in manufacturing an nMOS transistor according to the fifth embodiment.

As shown in FIG. 23A, a thermal oxide film 93 having a thickness of about 200 Å is formed by thermally oxidizing the surface region of the p-type silicon semiconductor substrate 81 exposed on the inner wall surface of the second trench 91. This thermal oxide film 93 prevents any spread of a damaged layer formed in the inner wall surface region of the second trench 91 by etching.

Figure 23B:
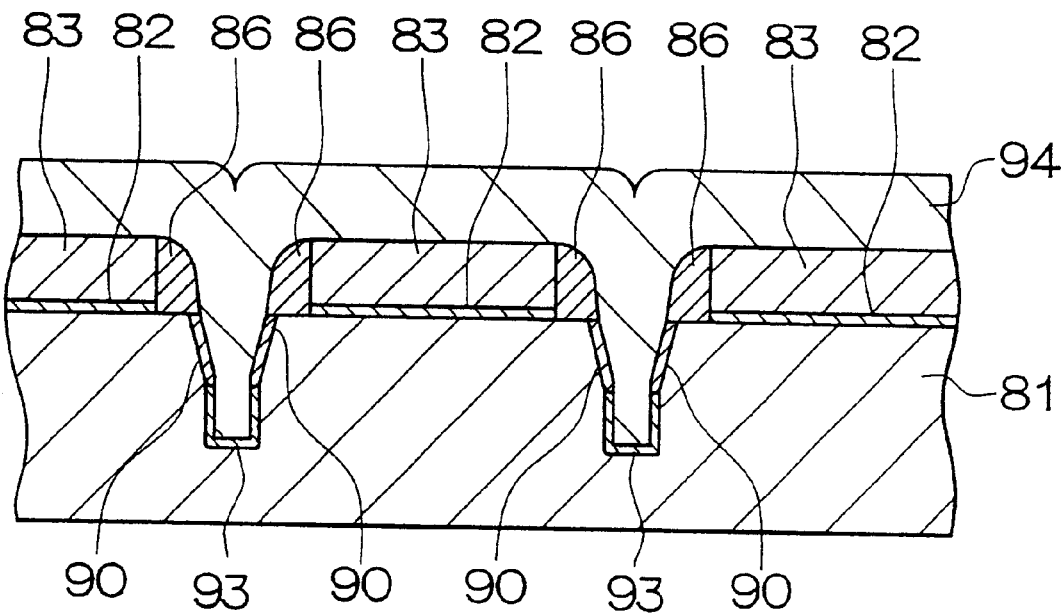

As shown in FIG. 23B, a silicon oxide film 94 having a thickness of about 7,000 Å is formed by low pressure CVD method on the entire surface including the inner surfaces of the first and second trenches 88 and 91. With this processing, the first and second trenches 88 and 91 are completely filled with the silicon oxide film 94.

Figure 23C:
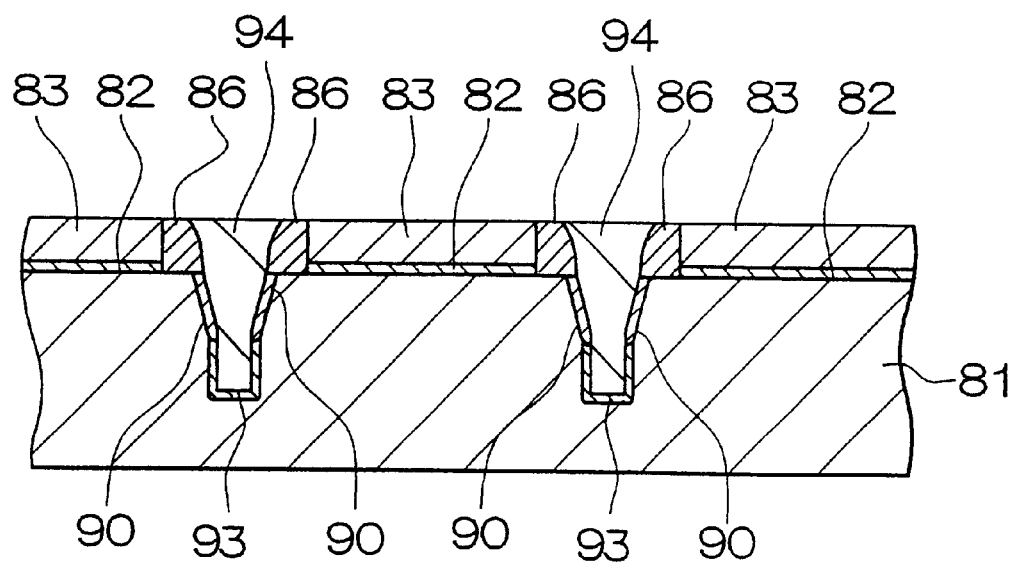

As shown in FIG. 23C, the silicon oxide film 94 is removed by chemical mechanical polishing (CMP) method until the silicon nitride film 83 serving as a stopper is exposed.

Figure 23D:
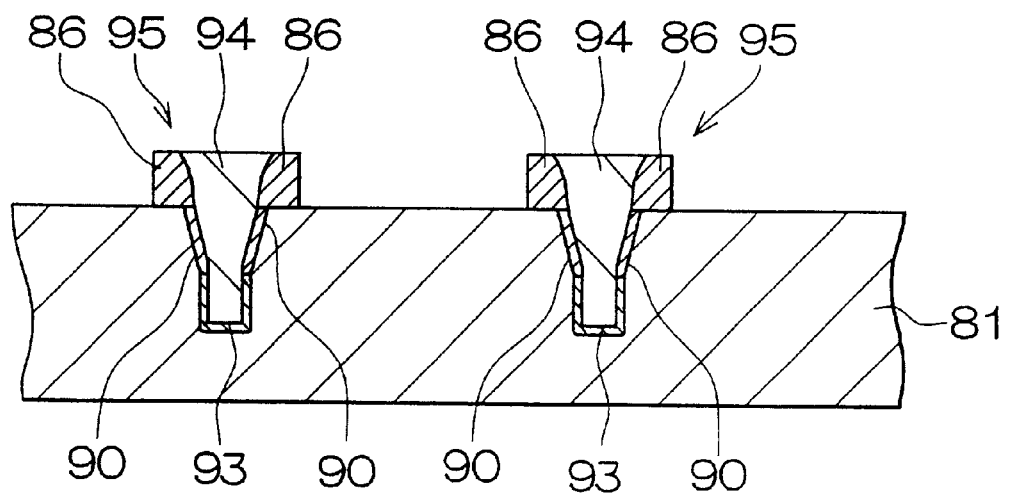

As shown in FIG. 23D, the silicon nitride film 83 is removed by wet etching with hot phosphoric acid. Subsequently, the thermal oxide film 82 is removed with hydrofluoric acid or the like to expose the surface of the p-type silicon semiconductor substrate 81. As a result, a trench element isolation structure 95 constituted by the silicon oxide film 94 and the side wall 86 is formed. At this time, the side wall 86 is exposed at the side edge of the silicon oxide film 94 filling the first and second trenches 88 and 91. As is apparent from FIG. 23D, the side wall 86 is formed around the first trench 88.

Since the side wall 86 made of the low-etching-rate thermal oxide film 85 can be formed to cover the outer peripheral surface of the silicon oxide film 94 forming the trench element isolation structure 95, the trench element isolation structure 95 becomes more resistant to etching. Therefore, the side wall 86 (thermal oxide film 85) can reliably protect the trench element isolation structure 95 from subsequent etching or cleaning, and can prevent it from being removed.

Figure 24:
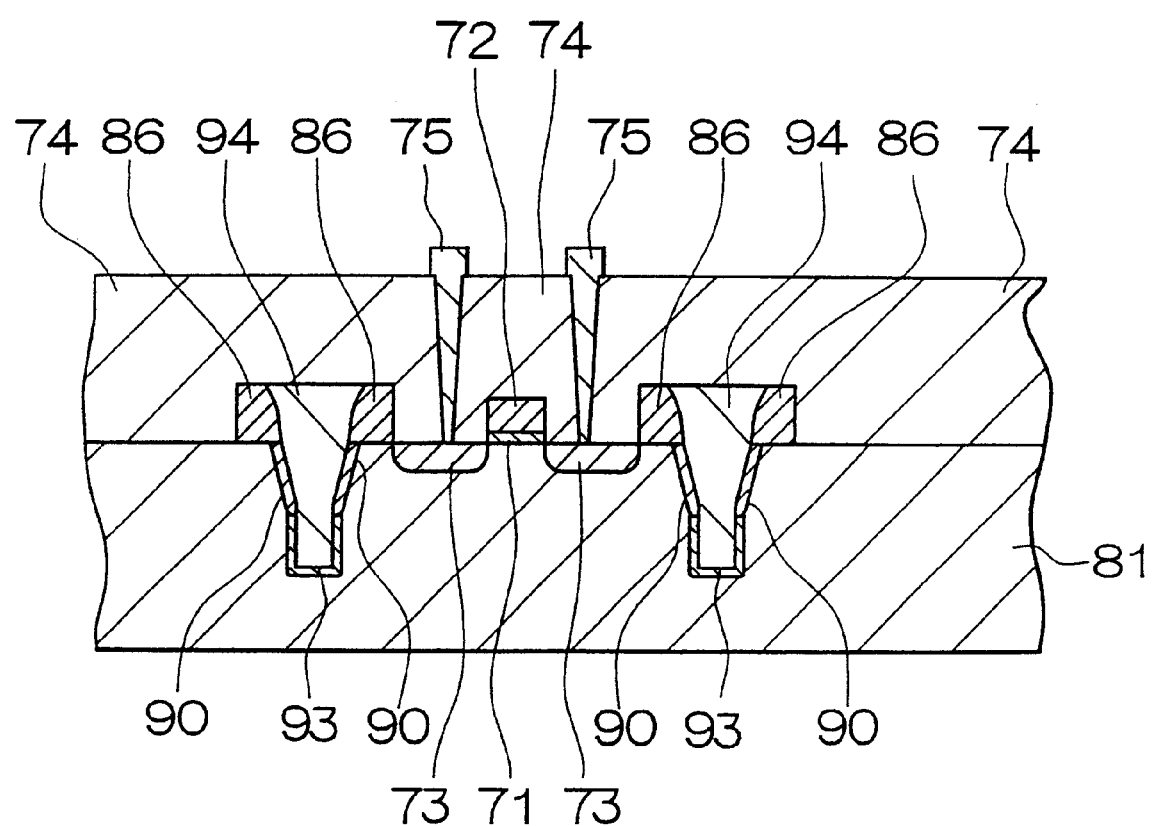
FIG. 24 is a schematic sectional view showing the nMOS transistor according to the fifth embodiment.

Following the same steps as those in the fourth embodiment, an nMOS transistor is completed, as shown in FIG. 24.

As described above, in the fifth embodiment of the present invention, the side wall 86 made of the thermal oxide film 85 can be formed at the outer edge of the trench element isolation structure 95.

With this structure, the outer edge of the trench element isolation structure 95 is covered with the low-etching-rate thermal oxide film 85. A trench element isolation structure 95 resistant to subsequent etching, cleaning, and the like can be obtained.

The trench element isolation structure 95 is not removed and depressed from the surface of the p-type silicon semiconductor substrate 81. Even if a gate electrode is formed over the element active region from the trench element isolation structure 95, concentration of an electric field at the element isolation end can be relaxed.

Similar to the first embodiment, the inclined surface 89 formed on the side wall of the first trench 88 can prevent concentration of an electric field near the inclined surface 89 on the p-type silicon semiconductor substrate 81, and can suppress formation of a parasitic transistor over the trench element isolation structure 95.

The threshold voltage of the nMOS transistor can be kept constant and can be prevented from varying.

The side wall 92 of the second trench 91 can be formed nearly perpendicular to the surface of the p-type silicon semiconductor substrate 81 by dry etching in an atmosphere mixture of hydrogen bromide (HBr) and oxygen. Accordingly, the second trench 91 can be made sufficiently deep, and adjacent element formation regions can be reliably electrically isolated.

An nMOS transistor exhibiting excellent electrical characteristics can be formed in the element formation region defined by the trench element isolation structure 95 having the first and second trenches 88 and 91.

As a result, a MOS transistor in which any decrease in threshold voltage is suppressed, and the leakage current is minimized can be realized.

Note that the trench having a predetermined angle according to the above embodiment may be applied to a buried field-shielded element isolation structure and a buried memory capacitor.

What is claimed is:

1. A method of manufacturing a semiconductor device, comprising:

the first step of forming a first insulating film on a semiconductor substrate;

the second step of selectively removing said first insulating film to partially expose said semiconductor substrate;

the third step of removing said semiconductor substrate exposed conforming to a shape of said first insulating film, thereby forming a first trench having a side wall formed by an inclined surface making a predetermined angle with a surface of said semiconductor substrate;

the fourth step of forming a second insulating film to cover an inner wall surface of the first trench including the inclined surface;

the fifth step of removing said second insulating film from a bottom surface of the first trench to expose said semiconductor substrate on the bottom surface of the first trench;

the sixth step of removing said semiconductor substrate exposed on the bottom surface of the first trench, thereby forming a second trench which continues from a side wall of the first trench and has a side wall substantially perpendicular to the surface of said semiconductor substrate;

the seventh step of forming a third insulating film on an entire surface including inner surfaces of the first and second trenches, thereby filling the first and second trenches;

the eighth step of removing said third insulating film until said first insulating film is exposed; and the ninth step of removing said first insulating film.

2. A method according to claim 1, wherein the angle of the inclined surface of the first trench formed in the third step falls within a range of 60° to 70° with respect to the surface of said semiconductor substrate.

3. A method according to claim 1, wherein the first trench formed in the third step is substantially equal in depth to the second trench formed in the sixth step.

4. A method according to claim 1, wherein the eighth step comprises removing said third insulating film by chemical mechanical polishing method.

5. A method according to claim 1, wherein said method further comprises, before the first step, the 10th step of forming a pad insulating film on said semiconductor substrate, the first step comprises forming said first insulating film via said pad insulating film, the second step comprises selectively removing said pad insulating film together with said first insulating film, and said method further comprises, after the ninth step, the 11th step of removing said pad insulating film left on said semiconductor substrate.

6. A method according to claim 1, further comprising, between the sixth and seventh steps, the 12th step of forming a fourth insulating film to cover an inner wall surface of the second trench.

7. A method according to claim 1, wherein the third step comprises removing said semiconductor substrate by dry etching in an atmosphere containing at least chlorine, thereby forming the first trench having the side wall formed by the inclined surface.

8. A method according to claim 7, wherein the third step comprises performing dry etching in an atmosphere mixture of hydrogen bromide and chlorine.

9. A method according to claim 1, wherein the sixth step comprises removing said semiconductor substrate by dry etching in an atmosphere mixture of hydrogen bromide and oxygen, thereby forming the second trench.

10. A method according to claim 1, wherein said first insulating film is a silicon nitride film.

11. A method according to claim 1, wherein the fourth step comprises thermally oxidizing said semiconductor substrate exposed in the first trench, thereby forming said second insulating film.

12. A method according to claim 11, wherein said semiconductor substrate is thermally oxidized in a dilute nitrogen atmosphere.

13. A method of manufacturing a semiconductor device, comprising:

the first step of forming a first insulating film on a semiconductor substrate;

the second step of forming a second insulating film on said first insulating film;

the third step of selectively removing said second insulating film to form an opening through which said first insulating film is exposed;

the fourth step of forming an oxidizable film on an entire surface of said semiconductor substrate;

the fifth step of removing said oxidizable film until said first insulating film is exposed in the opening, thereby forming a first side wall made of said oxidizable film at a side wall of said second insulating film in the opening;

the sixth step of forming a third insulating film on the entire surface of said semiconductor substrate;

the seventh step of removing said third insulating film until said semiconductor substrate is exposed in the opening, thereby forming a second side wall made of said third insulating film so as to cover said first side wall;

the eighth step of removing said semiconductor substrate exposed in the opening by using said second insulating film and said second side wall as a mask, thereby forming a trench in said semiconductor substrate;

the ninth step of forming a fourth insulating film on the entire surface of said semiconductor substrate to fill the trench;

the 10th step of removing said fourth insulating film until said second insulating film is exposed;

the 11th step of removing said first and second insulating films to expose said underlying semiconductor substrate; and the 12th step of heat-treating said semiconductor substrate to thermally oxidize said first side wall made of said oxidizable film.

14. A method according to claim 13, wherein the 12th step comprises thermally oxidizing said first side wall film and the surface of said semiconductor substrate to form a gate oxide film on the surface of said semiconductor substrate.

15. A method according to claim 13, wherein the 10th step comprises removing said fourth insulating film by chemical mechanical polishing method.

16. A method according to claim 13, further comprising, between the eighth and ninth steps, the 13th step of forming a fifth insulating film to cover an inner wall surface of the trench.

17. A method of manufacturing a semiconductor device, comprising:

the first step of forming a first insulating film on a semiconductor substrate;

the second step of selectively removing said first insulating film to form an opening through which said semiconductor substrate is exposed;

the third step of forming an oxidizable film on an entire surface of said semiconductor substrate;

the fourth step of heat-treating said semiconductor substrate to form a thermal oxide film of said oxidizable film;

the fifth step of removing said thermal oxide film on said first insulating film to form a side wall made of said thermal oxide film at a side wall of said first insulating film in the opening;

the sixth step of removing said semiconductor substrate exposed in the opening by using said first insulating film and said side wall as a mask, thereby forming a trench in said semiconductor substrate;

the seventh step of forming a second insulating film on an entire surface of said semiconductor substrate to fill the trench;

the eighth step of removing said second insulating film until said first insulating film is exposed; and the ninth step of removing said first insulating film to expose said underlying semiconductor substrate.

18. A method according to claim 17, wherein the first step comprises forming said first insulating film via a pad insulating film, the second step comprises selectively removing said pad insulating film together with said first insulating film, thereby forming the opening, and the ninth step comprises removing said pad insulating film together with said first insulating film.

19. A method according to claim 17, further comprising, after the ninth step, thermally oxidizing the surface of said semiconductor substrate to form a gate oxide film on the surface of said semiconductor substrate.

20. A method according to claim 17, wherein the eighth step comprises removing said second insulating film by chemical mechanical polishing method.

21. A method according to claim 17, further comprising, between the sixth and seventh steps, the 10th step of forming a third insulating film to cover an inner wall surface of the trench.

22. A method of manufacturing a semiconductor device, comprising:

the first step of forming a first insulating film on a semiconductor substrate;

the second step of forming a second insulating film on said first insulating film;

the third step of selectively removing said second insulating film to form an opening through which said first insulating film is exposed;

the fourth step of forming an oxidizable film on an entire surface of said semiconductor substrate;

the fifth step of removing said oxidizable film until said first insulating film is exposed in the opening, thereby forming a first side wall made of said oxidizable film at a side wall of said second insulating film in the opening;

the sixth step of forming a third insulating film on the entire surface of said semiconductor substrate;

the seventh step of removing said third insulating film and said first insulating film until said semiconductor substrate is exposed in the opening, thereby forming a second side wall made of said third insulating film so as to cover said first side wall;

the eighth step of removing said semiconductor substrate exposed in the opening by using said second insulating film and said second side wall as a mask, thereby forming a first trench having a side wall formed by an inclined surface making a predetermined angle with the surface of said semiconductor substrate;

the ninth step of forming a fourth insulating film on an inner wall surface of the first trench including the inclined surface;

the 10th step of removing said fourth insulating film from a bottom surface of the first trench, thereby exposing said semiconductor substrate on the bottom surface of the first trench;

the 11th step of removing said semiconductor substrate exposed on the bottom surface of the first trench, thereby forming a second trench which continues from a side wall of the first trench and has a side wall substantially perpendicular to the surface of said semiconductor substrate;

the 12th step of forming a fifth insulating film on an entire surface including inner surfaces of the first and second trenches, thereby filling the first and second trenches;

the 13th step of removing said fifth insulating film until said second insulating film is exposed;

the 14th step of removing said first and second insulating films to expose said underlying semiconductor substrate; and the 15th step of heat-treating said semiconductor substrate to thermally oxidize the first side wall made of said oxidizable film.

23. A method according to claim 22, wherein the angle of the inclined surface of the first trench formed in the eighth step falls within a range of 60° to 70° with respect to the surface of said semiconductor substrate.

24. A method according to claim 22, wherein the 13th step comprises removing said fifth insulating film by chemical mechanical polishing method.

25. A method according to claim 22, wherein the eighth step comprises removing said semiconductor substrate by dry etching in an atmosphere containing at least chlorine, thereby forming the first trench having the side wall formed by the inclined surface.

26. A method according to claim 22, further comprising, between the 11th and 12th steps, the 16th step of forming a sixth insulating film to cover an inner wall surface of the second trench.

27. A method of manufacturing a semiconductor device, comprising:

the first step of forming a first insulating film on a semiconductor substrate;

the second step of selectively removing said first insulating film to form an opening through which said semiconductor substrate is exposed;

the third step of forming an oxidizable film on an entire surface of said semiconductor substrate;

the fourth step of heat-treating said semiconductor substrate to form a thermal oxide film of said oxidizable film;

the fifth step of removing said thermal oxide film until the surface of said semiconductor substrate is exposed in the opening, thereby forming a side wall made of said thermal oxide film at side walls of said first and second insulating films in the opening;

the sixth step of removing said semiconductor substrate exposed in the opening by using said first insulating film and said side wall as a mask, thereby forming a first trench having a side wall formed by an inclined surface making a predetermined angle with the surface of said semiconductor substrate;

the seventh step of forming a second insulating film on an inner wall surface of the first trench including the inclined surface;

the eighth step of removing said second insulating film from a bottom surface of the first trench to expose said semiconductor substrate on the bottom surface of the first trench;

the ninth step of removing said semiconductor substrate exposed on the bottom surface of the first trench, thereby forming a second trench which continues from a side wall of the first trench and has a side wall substantially perpendicular to the surface of said semiconductor substrate;

the 10th step of forming a third insulating film on an entire surface including inner surfaces of the first and second trenches, thereby filling the first and second trenches;

the 11th step of removing said third insulating film until said first insulating film is exposed; and the 12th step of removing said first insulating film.

28. A method according to claim 27, wherein the angle of the inclined surface of the first trench formed in the sixth step falls within a range of 60° to 70° with respect to the surface of said semiconductor substrate.

29. A method according to claim 27, wherein the 11th step comprises removing said third insulating film by chemical mechanical polishing method.

30. A method according to claim 27, wherein the sixth step comprises removing said semiconductor substrate by dry etching in an atmosphere containing at least chlorine, thereby forming the first trench having the side wall formed by the inclined surface.

31. A method according to claim 27, further comprising, between the ninth and 10th steps, the 13th step of forming a fourth insulating film to cover an inner wall surface of the second trench.

32. A method according to claim 27, wherein the first step comprises forming said first insulating film via a pad insulating film, the second step comprises selectively removing said pad insulating film together with said first insulating film, thereby forming the opening, and the 12th step comprises removing said pad insulating film together with said first insulating film.

* * * * *